(12) United States Patent
Zhu

(10) Patent No.: US 12,334,917 B2
(45) Date of Patent: Jun. 17, 2025

(54) VOLTAGE-SOURCE GATE DRIVE HAVING SHUNT CAPACITORS AND SHUNT RESISTORS

(71) Applicant: UNITED SILICON CARBIDE, INC., Princeton, NJ (US)

(72) Inventor: Ke Zhu, Princeton, NJ (US)

(73) Assignee: UNITED SILICON CARBIDE, INC., Scottsdale, AZ (US)

(*) Notice: Subject to any disclaimer, the term of this patent is extended or adjusted under 35 U.S.C. 154(b) by 84 days.

(21) Appl. No.: 18/458,442

(22) Filed: Aug. 30, 2023

(65) Prior Publication Data

US 2024/0204774 A1 Jun. 20, 2024

Related U.S. Application Data

(60) Provisional application No. 63/387,784, filed on Dec. 16, 2022.

(51) Int. Cl.
| | |
|---|---|
| H03K 17/687 | (2006.01) |
| H03K 17/06 | (2006.01) |
| H03K 17/16 | (2006.01) |

(52) U.S. Cl.
CPC ......... *H03K 17/687* (2013.01); *H03K 17/063* (2013.01); *H03K 17/168* (2013.01); *H03K 2217/0081* (2013.01)

(58) Field of Classification Search
None
See application file for complete search history.

(56) References Cited

U.S. PATENT DOCUMENTS

| | | | | |
|---|---|---|---|---|
| 4,831,280 A | * | 5/1989 | Caya | H03K 17/6872 327/179 |
| 5,204,504 A | * | 4/1993 | Tanaka | H03K 17/04123 219/661 |

(Continued)

FOREIGN PATENT DOCUMENTS

| | | |
|---|---|---|
| JP | 5069259 B2 | 11/2012 |
| WO | 2017026367 A1 | 2/2017 |
| WO | 2020084808 A1 | 4/2020 |

OTHER PUBLICATIONS

März, A et al., "Improving the performance of SiC trench MOSFETs under hard switching operation," 2017 IEEE 12th International Conference on Power Electronics and Drive Systems (PEDS), Dec. 12-15, 2017, Honolulu, HI, USA, IEEE, pp. 553-558.

(Continued)

*Primary Examiner* — Kenneth B Wells
(74) *Attorney, Agent, or Firm* — Slayden Grubert Beard PLLC

(57) ABSTRACT

Disclosed is a device that decouples switching speed and gate delay time using an improved voltage-source gate driver. A shunt capacitor and a shunt resistor are connected in series to parallel across gate resistors of a voltage-source gate driver. The shunt capacitor and shunt resistor allow the gate delay and switching speed effect of the gate resistors to be decoupled. The shunt capacitor provides an initial high charge voltage and discharge gate current to reduce gate delay time. The shunt resistor modifies the effective gate resistance, which affects the gate current and the resulting switching speed. Shunt capacitor and shunt resistor values are determined to achieve the desired switching speed control with minimum gate delay time. When multiple power devices are paralleled, a common gate resistor, a shunt resistor and a capacitor combination is used. Each power device is also provided a respective split-gate resistor.

20 Claims, 10 Drawing Sheets

(56) References Cited

U.S. PATENT DOCUMENTS

| | | | | |
|---|---|---|---|---|
| 5,936,360 | A * | 8/1999 | Kaneko | H05B 41/3927 |
| | | | | 315/307 |
| 6,661,276 | B1 * | 12/2003 | Chang | H03K 17/6877 |
| | | | | 327/427 |
| 7,068,018 | B2 * | 6/2006 | Kanakubo | G05F 1/575 |
| | | | | 323/276 |
| 7,116,153 | B2 * | 10/2006 | Pai | H03K 17/6877 |
| | | | | 327/427 |
| 7,233,191 | B2 * | 6/2007 | Wang | H03K 17/04123 |
| | | | | 327/430 |
| 7,348,826 | B1 * | 3/2008 | Klein | H03K 17/302 |
| | | | | 327/421 |
| 7,746,156 | B1 * | 6/2010 | Massie | H03K 17/063 |
| | | | | 327/427 |
| 8,203,377 | B2 * | 6/2012 | Kelley | H03K 17/04123 |
| | | | | 327/170 |
| 8,558,587 | B2 * | 10/2013 | Machida | H02M 1/08 |
| | | | | 327/427 |
| 9,755,639 | B2 * | 9/2017 | Kampl | H03K 17/74 |
| 9,935,625 | B2 | 4/2018 | Yamaguchi | |
| 10,263,538 | B2 * | 4/2019 | Ikeda | H10D 62/111 |
| 10,348,286 | B2 * | 7/2019 | Chuang | H10D 62/83 |
| 10,476,495 | B2 * | 11/2019 | Shimomura | H03K 17/687 |
| 10,644,590 | B2 | 5/2020 | Giuliano et al. | |
| 11,031,935 | B2 * | 6/2021 | Arisawa | H03K 17/08122 |
| 11,165,421 | B1 * | 11/2021 | Nosaka | H02M 1/08 |
| 11,522,540 | B2 * | 12/2022 | Lin | H03K 17/162 |
| 2002/0159276 | A1 * | 10/2002 | Deboy | H02M 3/33507 |
| | | | | 363/20 |

OTHER PUBLICATIONS

Peftitsis, D. et al., "Experimental Comparison of Different Gate-Driver Configurations for Parallel-Connection of Normally-on SiC JFETs," Proceedings of the 7th International Power Electronics and Motion Control Conference, Jun. 2-5, 2012, Harbin, China, IEEE, pp. 16-22.

Extended European Search Report for European Patent Application No. 23216422.8, mailed May 8, 2024, 9 pages.

PSEMI, "PE29102," Product Specification, DOC-81227-7, Nov. 2018, pSemi Corporation, 16 pages.

PSEMI, "Using Peregrine's High-Speed FETDrivers," Application Note 71, DOC-86603-1, Feb. 2018, pSemi Corporation, 18 pages.

* cited by examiner

VOLTAGE-SOURCE GATE DRIVE HAVING SHUNT CAPACITORS AND SHUNT RESISTORS

CROSS-REFERENCE TO RELATED APPLICATIONS

This application claims priority to U.S. Provisional Application No. 63/387,784 filed Dec. 16, 2022, entitled "Voltage-Source Gate Drive Using Shunt Capacitor and Resistor that Decouples Switching Speed Control and Gate Delay Time," and which is expressly incorporated herein by reference in its entirety.

FIELD OF THE DISCLOSURE

The present disclosure relates power semiconductor devices and more particularly to voltage-source gate drive circuits for driving the power semiconductor devices.

BACKGROUND

Power semiconductor devices are typically used in power electronic circuits to provide power conversion functions. In application, a faster switching speed is beneficial to the operation of the power semiconductor devices as it reduces switching losses associated with the power semiconductor devices.

Nevertheless, the faster switching speed increases electromagnetic interference and a risk of oscillation. In this regard, a gate delay and the switching speed of a semiconductor power device are correlated. A slower switching speed increases switching losses and introduces a longer gate delay that may not be desirable from a control or a protection point of view. A faster switching speed raises challenges in complying with electromagnetic compatibility and electromagnetic interference industry standards and causes voltage spikes, a ringing, and an electromagnetic interference that makes it more difficult to achieve an electromagnetic compatibility and to avoid oscillation. Furthermore, a longer gate delay has negative impacts on a protection, a parallel synchronization, and a circuit operation of power electronic circuits. Another challenge in optimizing a switching speed and a gate delay of power electronic circuits is having to accommodate for input capacitances ($C_{ISS}$) of the semiconductor power devices. A semiconductor power device may have a long gate delay due to a high input capacitance ($C_{ISS}$) that is proportional to a die size of the semiconductor power device. Therefore, depending on a design, a structure, or an application of the semiconductor power devices, the gate delay becomes even longer and more prominent when a semiconductor power device comprises, for example, paralleled transistors, since each paralleled branch of the semiconductor power device would have a characteristic input capacitance ($C_{ISS}$). Therefore, there is a need for improved voltage-source gate drivers.

SUMMARY

Aspects are disclosed for controlling a semiconductor power device that decouples control of the power device switching speed and gate delay time using an improved voltage-source gate driver. In one aspect, a voltage-source gate driver is described. The voltage-source gate driver comprises a power converter that includes an input configured to receive a first gate signal and provide a regulated output voltage at an output node. The voltage-source gate driver further comprises a gate-driver resistor network having at least one gate resistance coupled between the output node of the power converter and an output terminal of the voltage-source gate driver, a shunt capacitor connected in parallel across the gate-driver resistor network. In this manner, the output terminal is configured to provide a second gate signal to a gate of the semiconductor power device.

In an embodiment, the shunt capacitor has a value that is calculated using the following equations:

$$(V_{DD} - V_{EE}) \times \frac{C_{GSNT}}{C_{GSNT} + C_{ISS}} + V_{EE} = V_{TH}$$

$$V_{DD} - (V_{DD} - V_{EE}) \times \frac{C_{GSNT}}{C_{GSNT} + C_{ISS}} = V_{TH}$$

In this regard, the equations are solved for the shunt capacitor $C_{GSNT}$, wherein $V_{DD}$ is a positive supply voltage, $V_{EE}$ is a negative supply voltage, $C_{ISS}$ is an input capacitance of the semiconductor power device, and $V_{TH}$ is a threshold voltage of the semiconductor power device.

In an embodiment, the voltage-source gate driver further comprises a shunt resistor connected in series with the shunt capacitor, wherein the shunt resistor and the shunt capacitor are connected in parallel across the gate-driver resistor network. The first shunt resistor is in the range of 0Ω to 10MΩ.

In an embodiment, the gate-driver resistor network has an equivalent resistance value in the range of 0Ω to 10MΩ.

In an embodiment, the power converter comprises one of a voltage rectifier, regulator, inverter, or converter.

In an embodiment, the voltage-source gate driver further comprises a solid-state circuit breaker.

In an embodiment, the semiconductor power device includes a half-bridge circuit topology.

In an embodiment, the semiconductor power device is a paralleled transistor connection circuit topology.

In an embodiment, the semiconductor power device is a common-source circuit topology.

In an embodiment, the semiconductor power device is one of a half-bridge circuit topology, a paralleled transistor connection circuit topology, or a common-source circuit topology.

In an embodiment, the semiconductor power device is a metal-oxide field-effect transistor.

In an embodiment, the semiconductor power device is one of insulated gate bipolar transistors (IGBTs), junction-gate field-effect transistors (JFETs), or high electron mobility transistors (HEMTs).

In another aspect, a power system comprising a voltage-source gate driver and a semiconductor power device is disclosed. The voltage-source gate driver comprises a power converter that includes an input configured to receive a first gate signal and provide a regulated output voltage at an output node, a gate-driver resistor network having at least one gate resistance coupled between the output node of the power converter and an output terminal of the voltage-source gate driver, and a shunt capacitor connected in parallel across the gate-driver resistor network, and wherein the output terminal configured to provide a second gate signal. The semiconductor power device comprises a gate terminal, a drain terminal, and a source terminal, wherein the semiconductor power device is configured to receive the second gate signal at the gate terminal.

In an embodiment, the shunt capacitor has a value that is calculated using the following equations:

$$(V_{DD} - V_{EE}) \times \frac{C_{GSNT}}{C_{GSNT} + C_{ISS}} + V_{EE} = V_{TH}$$

$$V_{DD} - (V_{DD} - V_{EE}) \times \frac{C_{GSNT}}{C_{GSNT} + C_{ISS}} = V_{TH}$$

In this regard, the equations are solved for the shunt capacitor $C_{GSNT}$, wherein $V_{DD}$ is a positive supply voltage, $V_{EE}$ is a negative supply voltage, $C_{ISS}$ is an input capacitance of the semiconductor power device, and $V_{TH}$ is a threshold voltage of the semiconductor power device.

In an embodiment, the power system further comprises a shunt resistor connected in series with the shunt capacitor, wherein the shunt resistor and the shunt capacitor are connected in parallel across the gate-driver resistor network. The first shunt resistor is in the range of 0Ω to 10MΩ.

In an embodiment, the gate-driver resistor network has an equivalent resistance value in the range of 0Ω to 10MΩ.

In an embodiment, the power converter comprises one of a voltage rectifier, regulator, inverter, or converter.

In an embodiment, the semiconductor power device is a metal-oxide field-effect transistor.

In an embodiment, the semiconductor power device is one of a half-bridge circuit topology, a paralleled transistor connection circuit topology, or a common-source circuit topology.

In an embodiment, the semiconductor power device is one of insulated gate bipolar transistors (IGBTs), junction-gate field-effect transistors (JFETs), or high electron mobility transistors (HEMTs).

Those skilled in the art will appreciate the scope of the present disclosure and realize additional aspects thereof after reading the following detailed description in association with the accompanying drawings.

BRIEF DESCRIPTION OF THE DRAWINGS

The accompanying drawing figures incorporated in and forming a part of this specification illustrate several aspects of the disclosure and, together with the description, serve to explain the principles of the disclosure.

FIG. 3A illustrates an exemplary half-bridge circuit topology.

FIG. 3B shows an exemplary paralleled transistor connection circuit topology.

FIG. 3C illustrates an exemplary common-source circuit topology.

FIG. 4A is graphs showing voltage and current characteristics of the semiconductor power device of the power system, as shown in FIG. 1, during a turn-off transition, wherein the power system includes a shunt capacitor $C_{GSNT}$ without a shunt resistor $R_{GSNT}$ ($R_{GSNT}$=0Ω).

FIG. 4B is graphs showing voltage and current characteristics of the semiconductor power device of the power system, as shown in FIG. 1, during a turn-on transition, wherein the power system includes a shunt capacitor $C_{GSNT}$ without a shunt resistor $R_{GSNT}$ ($R_{GSNT}$=0Ω).

FIG. 5A is graphs showing voltage and current characteristics of the semiconductor power device of the power system, as shown in FIG. 1, having a shunt capacitor $C_{GSNT}$ and a shunt resistor $R_{GSNT}$, and during a turn-off transition.

FIG. 5B is graphs showing voltage and current characteristics of the semiconductor power device of the power system, as shown in FIG. 1, having a shunt capacitor $C_{GSNT}$ and a shunt resistor $R_{GSNT}$, and during a turn-on transition.

FIG. 6A is graphs showing voltage and current characteristics of the semiconductor power device of the power system, as shown in FIG. 1, during a turn-off transition, and having a shunt capacitor $C_{GSNT}$, a shunt resistor $R_{GSNT}$, and a series-split gate resistor $R_G$.

FIG. 6B is graphs showing voltage and current characteristics of the semiconductor power device of the power system, as shown in FIG. 1, during a turn-on transition, and having a shunt capacitor $C_{GSNT}$, a shunt resistor $R_{GSNT}$, and a series-split gate resistor $R_G$.

FIG. 7A is graphs showing voltage and current characteristics of the semiconductor power device of the power system, as shown in FIG. 1, during a turn-off transition, and generated using a turn-on gate resistor $R_{G-ON}$ and a turn-off gate resistor $R_{G-OFF}$ having different values ($R_{G-ON}$=$R_{G-OFF}$=100Ω, $R_{G-ON}$=$R_{G-OFF}$=150Ω, and $R_{G-ON}$=$R_{G-OFF}$=200Ω).

FIG. 7B is graphs showing voltage and current characteristics of the discrete semiconductor power device of the power system, as shown in FIG. 1, during a turn-on transition, and generated using a turn-on gate resistor $R_{G-ON}$ and a turn-off gate resistor $R_{G-OFF}$ having different values ($R_{G-ON}$=$R_{G-OFF}$=100Ω, $R_{G-ON}$=$R_{G-OFF}$=150Ω, and $R_{G-ON}$=$R_{G-OFF}$=200Ω).

FIG. 8A is graphs showing voltage and current characteristics of the semiconductor power device of the power system, as shown in FIG. 1, during a turn-off transition, in the absence of a shunt capacitor $C_{GSNT}$ and a shunt resistor $R_{GSNT}$, and wherein the semiconductor power device comprises electrical characteristics that are suitable for slow-switching applications.

FIG. 8B is graphs showing voltage and current characteristics of the discrete semiconductor power device of the power system, as shown in FIG. 1, during a turn-on transition, in the absence of a shunt capacitor $C_{GSNT}$ and a shunt resistor $R_{GSNT}$, and wherein the semiconductor power device comprises electrical characteristics that are suitable for slow-switching applications.

FIG. 9A is graphs showing voltage and current characteristics of the discrete semiconductor power device of the power system, as shown in FIG. 1, during a turn-off transition, having a shunt capacitor $C_{GSNT}$ and a shunt resistor $R_{GSNT}$, and wherein the discrete semiconductor power device comprises electrical characteristics that are suitable for slow-switching applications.

FIG. 9B is graphs showing voltage and current characteristics of the semiconductor power device of the power system, as shown in FIG. 1, during a turn-on transition, having a shunt capacitor $C_{GSNT}$ and a shunt resistor $R_{GSNT}$, and wherein the semiconductor power device comprises electrical characteristics that are suitable for slow-switching applications.

DETAILED DESCRIPTION

Figure 1:
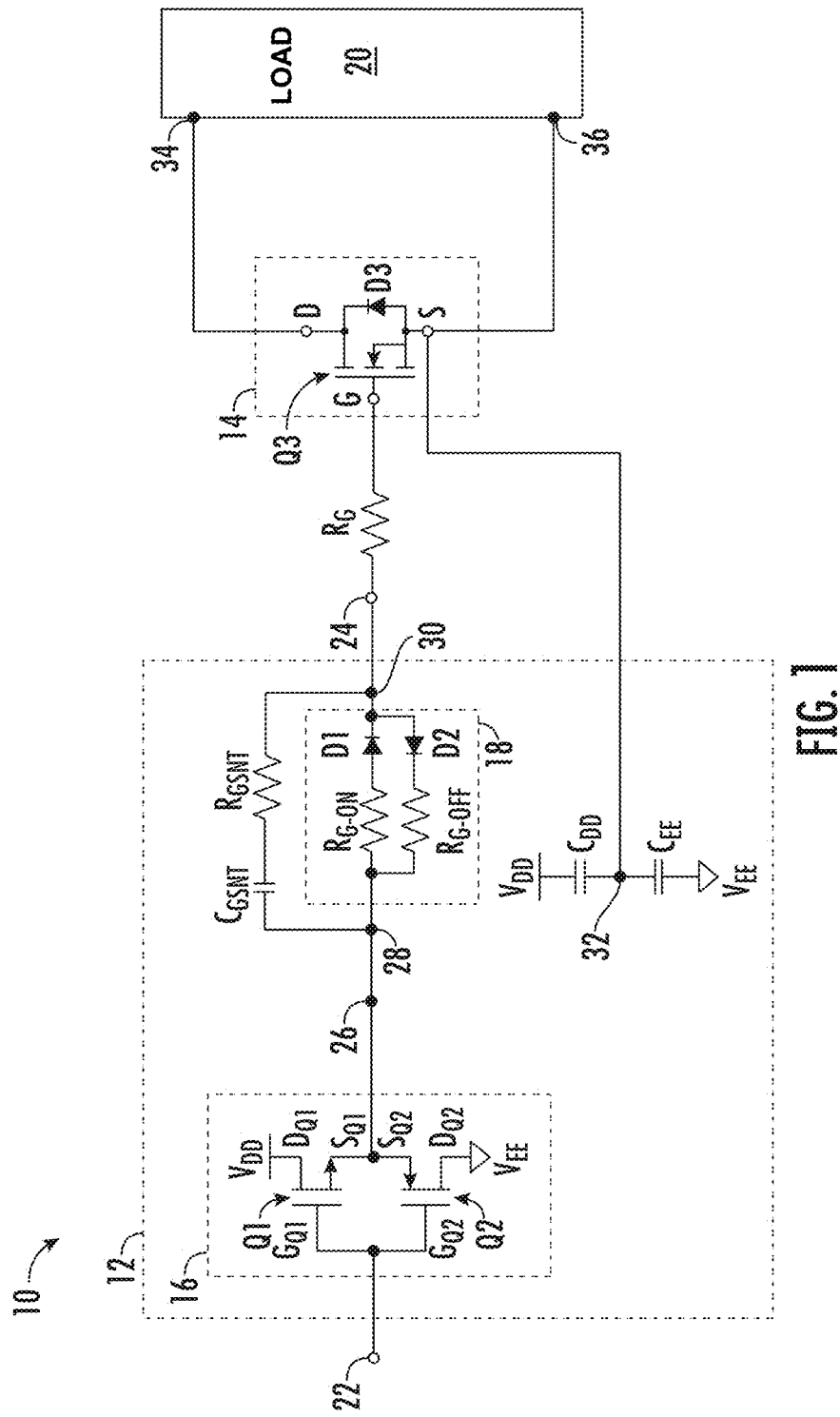
FIG. 1 shows an exemplary power system having a voltage-source gate driver coupled to a semiconductor power device.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

FIG. 1 shows an exemplary power system 10 having a voltage-source gate driver 12 coupled to a semiconductor power device 14. The voltage-source gate driver 12 receives an input gate signal $V_{IN}$ at an input terminal 22 and provides a controlled and amplified driving signal at an output terminal 24 that electrically couples to the semiconductor power device 14. In this manner, the voltage-source gate driver 12 operates as a current buffer and a signal converter and includes a power converter 16 and a gate-driver resistor network 18 that are connected in series between the input terminal 22 and the output terminal 24 of the voltage-source gate driver 12. In order to effectively control a switching speed and a gate delay of the semiconductor power device 14, a shunt capacitor $C_{GSNT}$ and a shunt resistor $R_{GSNT}$ are connected in series between a first internal node 28 and a second internal node 38. Furthermore, the series-connected shunt capacitor $C_{GSNT}$ and shunt resistor $R_{GSNT}$ are connected in parallel with the gate-driver resistor network 18 such that the first internal node 28 connects to an output node 26 of the power converter 16 and the second internal node 38 connects to the output terminal 24 of the voltage-source gate driver 12. In this manner, the shunt capacitor $C_{GSNT}$ and the shunt resistor $R_{GSNT}$ may be used as part of the voltage-source gate driver 12 to decouple the switching speed of the semiconductor power device 14 from the gate delay of the semiconductor power device 14 and to prevent any false gate loop oscillation and/or gate loop triggering in the semiconductor power device 14 as is described in more detail elsewhere herein.

The semiconductor power device 14 may be a metal-oxide semiconductor field-effect transistor (MOSFET) Q3 having an integrated body diode D3. However, the scope of the present disclosure is not so limited. The semiconductor power device 14 further includes a gate terminal G, a drain terminal D, and a source terminal S. The body diode D3 provides an internal current conduction path from the source terminal S to the drain terminal D and blocks high voltages and high currents from the drain terminal D to the source terminal S. Furthermore, the MOSFET Q3 comprises characteristic capacitances including a gate-to-source capacitance $C_{GS}$, a drain-to-source capacitance $C_{GS}$, and a gate-to-drain capacitance $C_{GD}$. In this regard, the input capacitance $C_{ISS}$ is the sum of gate-to-source capacitance $C_{GS}$ and gate-to-drain capacitance $C_{GD}$.

The drain terminal D and the source terminal S may be connected to a load 20 at a first load node 34 and a second load node 36, respectively. The semiconductor power device 14 in the power system 10 may be implemented to rectify, invert, convert, or otherwise manipulate electrical energy using a voltage-source gate driver, such as the voltage-source gate driver 12. The source terminal S of the MOSFET Q3 in the semiconductor power device 14 is connected and referenced to a reference node 32 between a positive supply voltage $V_{DD}$ and a negative supply voltage $V_{EE}$ that are stabilized by a capacitor $C_{DD}$ and a capacitor $C_{EE}$. In this regard, the positive supply voltage $V_{DD}$ may refer to a positive rail voltage that is in the range of 5V to 30V, 10V to 20V, or 12V to 15V. The negative supply voltage $V_{EE}$ may refer to a negative rail voltage that is in the range of 0V to −30V, −3V to −20V, −5V to −15V, or that is connected to the ground. Alternatively, the negative supply voltage $V_{EE}$ may be used in place of the positive supply voltage $V_{DD}$ depending on whether the semiconductor power device 14 is a normally-on or a normally-off semiconductor power device. A normally-off semiconductor power device 14 requires a positive gate-to-source voltage $V_{GS}$ to turn-on. Therefore, if the gate-to-source voltage $V_{GS}$ is 0 volts, the normally-off semiconductor power device 14 would be in an OFF-state. A normally-on semiconductor power device 14 requires a negative gate-to-source voltage $V_{GS}$ to turn off. Therefore, if the gate-to-source voltage $V_{GS}$ is 0 volts, the semiconductor power device 14 as a normally-on device is in an ON-state.

The voltage-source gate driver 12 operates as a current buffer and a signal converter and includes the power converter 16 and the gate-driver resistor network 18 that are connected in series between the input terminal 22 and the output terminal 24 of the voltage-source gate driver 12. The power converter 16 may be formed by a first transistor Q1 that is an N-channel MOSFET and a second transistor Q2 that is a P-channel MOSFET. In this regard, a drain terminal $D_{Q1}$ of the first transistor Q1 connects to a positive supply voltage $V_{DD}$, and a drain terminal $D_{Q2}$ of the second transistor Q2 connects to a negative supply voltage $V_{EE}$. A source terminal $S_{Q1}$ of the first transistor Q1 connects to a source terminal $S_{Q2}$ of the transistor Q2 and is electrically coupled to the output node 26. Furthermore, a gate terminal $G_{Q1}$ of the transistor Q1 connects to a gate terminal $G_{Q2}$ of the transistor Q2 and is electrically coupled to the input terminal 22. During the operation, the power converter 16 regulates an input gate signal $V_{IN}$ that is supplied to the input terminal 22 of the voltage-source gate driver 12 and provides a regulated output voltage VREG at the output node 26 that connects to the gate-driver resistor network 18. In other embodiments, the power converter 16 may be one of a voltage rectifier, regulator, inverter, or converter.

The gate-driver resistors network 18 connects between the output node 26 and the output terminal 24 of the voltage-source gate driver 12. The gate-driver resistor network 18 may comprise one or more resistors including a turn-on gate resistor $R_{G-ON}$ and a turn-off gate resistor $R_{G-OFF}$. The turn-on gate resistor $R_{G-ON}$ is connected to a first diode D1 to rectify a current flowing through the turn-on gate resistor $R_{G-ON}$ in a first direction. The turn-off gate resistor $R_{G-OFF}$ is connected to a second diode D2 to rectify a current flowing through the turn-off gate resistor $R_{G-OFF}$ that is in an opposite direction to the first direction. In this regard, the turn-on gate resistor $R_{G-ON}$ as connected to the first diode D1 and the turn-off gate resistor $R_{G-OFF}$ as connected to the second diode D2 are connected in parallel as shown in FIG. 1. In this regard, the turn-on gate resistor $R_{G-ON}$ may have a value that is in the range of 0Ω to 10MΩ, 1 kΩ to 5MΩ, or 100 kΩ to 3MΩ, and the turn-off gate resistor $R_{G-OFF}$ may have a value that is in the range of 0 to 10MΩ, 1 kΩ to 5MΩ, or 100 kΩ to 3MΩ. The gate-driver resistor network 18 may have an equivalent resistance value in the range of 0Ω to 10MΩ, 1 kΩ to 5MΩ, or 100 kΩ to 3MΩ.

Furthermore, a series-split gate resistor $R_G$ may be used to electrically couple (i.e., connect in series between) the output terminal 24 of the voltage-source gate driver 12 and a gate terminal G of the semiconductor power device 14. In this manner, the gate-driver resistor network 18 provides a resistive and rectified current and voltage at the output terminal 24 of the voltage-source gate driver 12 that is connects to the gate terminal G of the semiconductor power device 14 using the series-split gate resistor $R_G$ having a value that may be in the range of 0Ω to 10MΩ, 1 kΩ to 5MΩ, or 100 kΩ to 3MΩ. Therefore, values of the turn-on gate resistor $R_{G-ON}$, the turn-off gate resistor $R_{G-OFF}$, and the series-split gate resistor $R_G$ may affect a charging and discharging current of an input capacitance $C_{ISS}$ of the semiconductor power device 14. Increased values of the turn-on gate resistor $R_{G-ON}$ and the turn-off gate resistor $R_{G-OFF}$ increases a gate delay and reduces a switching speed of the semiconductor power device 14 from an off-state to an on-state or vice versa since the input capacitance $C_{ISS}$ should be charged or discharged above or below a threshold voltage $V_{TH}$ of the semiconductor power device 14 before the state of the semiconductor power device 14 is changed. Therefore, increased values of the turn-on gate resistor $R_{G-ON}$ and the turn-off gate resistor $R_{G-OFF}$ increases switching losses of the semiconductor power device 14 during an operation of the power system 10. In this regard, although the value of the series-split gate resistor $R_G$ may be increased such that the power system 10 meets electromagnetic compatibility and electromagnetic interference industry standards while avoiding oscillations, nevertheless, absent the shunt capacitor $C_{GSNT}$ and the shunt resistor $R_{GSNT}$, increasing the value the series-split gate resistor $R_G$ introduces a longer gate delay and higher switching losses that are undesirable in operation of the semiconductor power device 14.

The introduction of the series-connected shunt capacitor $C_{GSNT}$ and shunt resistor $R_{GSNT}$ that are connected in parallel across the gate-driver resistor network 18 enables a decoupling of the switching speed of the semiconductor power device 14 from the gate delay of the semiconductor power device 14. This is particularly advantageous as it enables the switching speed of the semiconductor power device 14 to be controlled while the semiconductor power device 14 maintains a reduced gate delay. In this regard, the shunt capacitor $C_{GSNT}$ enables an initial high charging and discharging of an input capacitance $C_{ISS}$ of the semiconductor power device 14 that reduces the gate delay. Therefore, during a turn-on period and a turn-off period, the shunt capacitor $C_{GSNT}$ acts as a series-connected capacitive voltage divider with the input capacitance $C_{ISS}$ of the semiconductor power device 14 to establish a gate-to-source voltage $V_{GS}$ while the shunt resistor $R_{GSNT}$ serves to prevent any false gate loop oscillation and/or gate loop triggering in the semiconductor power device 14. An implementation of the shunt capacitor $C_{GSNT}$ and the shunt resistor $R_{GSNT}$ is further advantageous as it eliminates a need for an external high voltage RC snubber circuit between a drain terminal D and a source terminal S of the semiconductor power device 14.

In this regard, the value of the shunt capacitor $C_{GSNT}$ may be determined (i.e., calculated) using equations (1) and (2) for a desired turn-on and turn-off performance of the power semiconductor device 14.

$$(V_{DD} - V_{EE}) \times \frac{C_{GSNT}}{C_{GSNT} + C_{ISS}} + V_{EE} = V_{TH} \quad (1)$$

$$V_{DD} - (V_{DD} - V_{EE}) \times \frac{C_{GSNT}}{C_{GSNT} + C_{ISS}} = V_{TH} \quad (2)$$

Accordingly, a value of the shunt resistor $R_{GSNT}$ may be in the range of MΩ to 10MΩ, 1 kΩ to 5MΩ, or 100 kΩ to 3MΩ. It is to be noted that the shunt resistor $R_{GSNT}$ may not be directly connected in series with the shunt capacitor $C_{GSNT}$ to achieve an oscillation damping function. Therefore, as long as a sufficiently resistive component exists as part of a gate drive loop, an oscillation damping function is achieved. In this regard, the gate drive loop is a gate current flow path that may include supply voltages $V_{DD}$ or $V_{EE}$, the gate-driver resistor network 18, and the semiconductor power device 14.

It is important to note that while the semiconductor power device 14 as shown in FIG. 1 is a MOSFET Q3, the scope of the present disclosure is not so limited. The MOSFET Q3 may be one of a P-type MOSFET or an N-type MOSFET. Those skilled in the art will appreciate that the semiconductor power device 14 may be one of insulated gate bipolar transistors (IGBTs), junction-gate field-effect transistors (JFETs), high electron mobility transistors (HEMTs), or the like. Furthermore, the semiconductor power device 14 may include a half-bridge circuit topology 30, a paralleled transistor connection circuit topology 30', or a common-source circuit topology 30" as shown and described in reference to FIGS. 3A to 3C. In this regard, the semiconductor power device 14 may form a discrete package or a power module.

Figure 2:
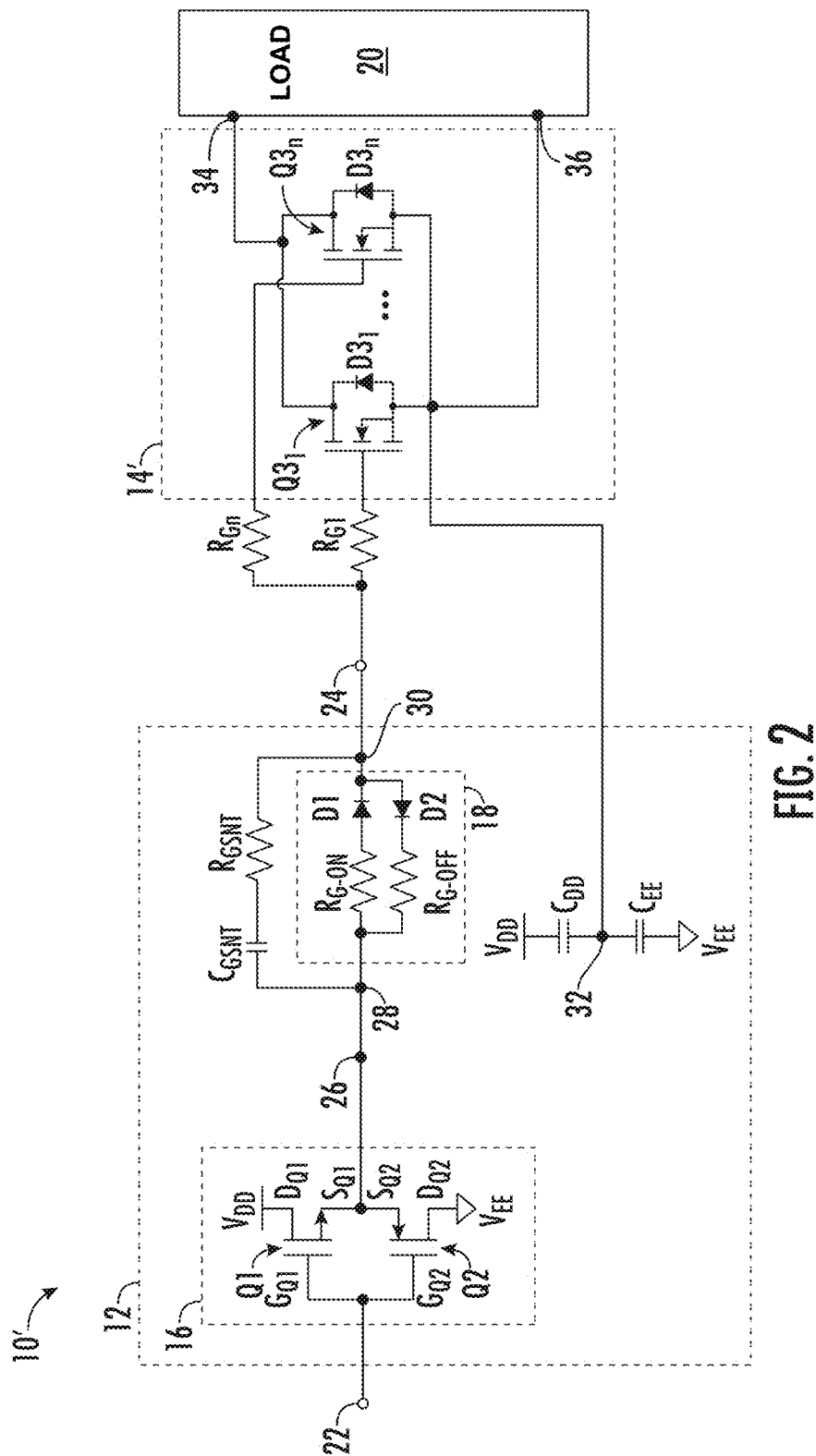
FIG. 2 shows another exemplary power system having a plurality of MOSFETs connected in parallel as part of the semiconductor power device.

FIG. 2 shows an exemplary power system 10' having a plurality of MOSFETs $Q3_1$ to $Q3_n$ connected in parallel as part of a semiconductor power device 14'. The power system 10' as shown in FIG. 2 is substantially similar to the power system 10 described in FIG. 1 except for the semiconductor power device 14' that includes a plurality of MOSFETs $Q3_1$ to $Q3_n$ (where n is a counting number), each having an integrated body diode $D3_1$ to $D3_n$, that are connected in parallel. A common drain node and a common source node of the semiconductor power device 14' (not shown for the simplicity of illustration) may be connected to a load 20 at a first load node 34 and a second load node 36, respectively. Elements as shown in FIG. 2 that were previously described in conjunction with FIG. 1 are not described here for brevity.

As shown in FIG. 2, each of the MOSFETs $Q3_1$ to $Q3_n$ further comprises a series-split gate resistor $R_{G1}$ to $R_{Gn}$, respectively. In this regard, the series-split gate resistors $R_{G1}$ to $R_{Gn}$ are used to dampen and avoid oscillation among the paralleled MOSFETs $Q3_1$ to $Q3_n$. Furthermore, increasing the value of each of the series-split gate resistors $R_{G1}$ to Ren reduces a switching speed of a respective one of the MOSFETs $Q3_1$ to $Q3_n$ of the semiconductor power device 14'. Alternatively, decreasing the value of each of the series-split gate resistor $R_{G1}$ to $R_{Gn}$ increases a switching speed of a respective one of the MOSFETs $Q3_1$ to $Q3_n$ of the semiconductor power device 14'. In an embodiment, a current buffer (not shown here for the simplicity of illustrations) stage may be implemented as part of the voltage-source gate driver 12 and in between the power converter 16 and the gate-driver resistor network 18. The current buffer may boost gate current capabilities of the voltage-source gate driver 12 in high current, high power applications. This is particularly advantageous when a plurality of semiconductor power devices are connected in parallel as shown in the semiconductor power device 14'. In this regard, the shunt capacitor $C_{GSNT}$ and the shunt resistor $R_{GSNT}$ operate in the same manner as described above to utilize the increased current driving capability of current buffer to further minimize the gate delay without affecting the switching speed.

Figure 3A:
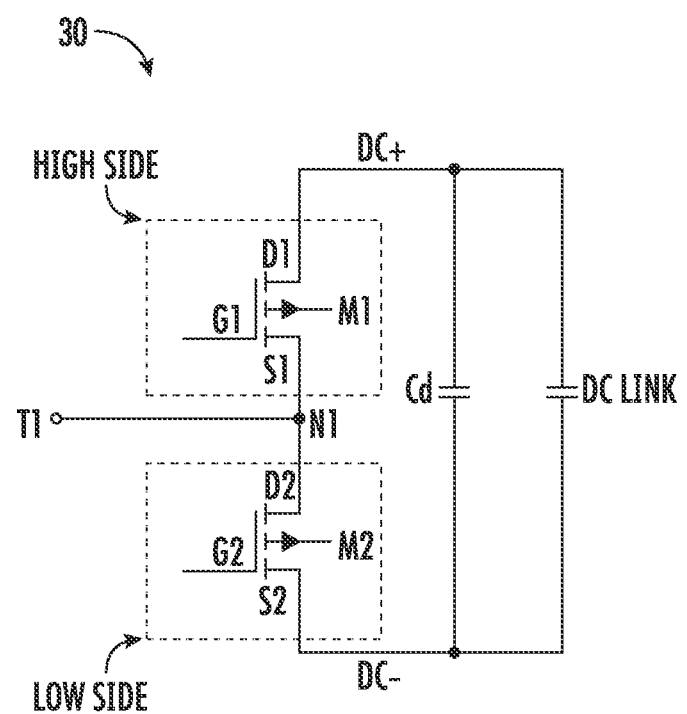
FIGS. 3A to 3C illustrate exemplary circuit topologies that are implemented in various embodiments of the present disclosure as part of the semiconductor power device of the power system as shown in FIG. 1.
Figure 3B:
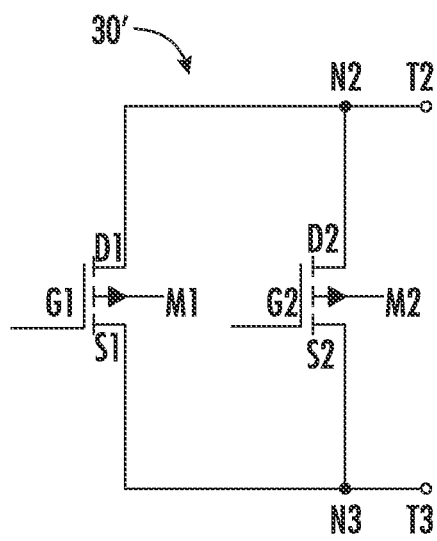
Figure 3C:
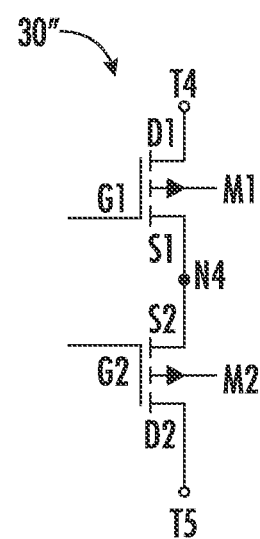

FIGS. 3A to 3C illustrate exemplary circuit topologies that are implemented in various embodiments of the present disclosure as part of the semiconductor power device 14 of the power system 10 as shown in FIG. 1. In this regard, a half-bridge circuit topology 30, a paralleled transistor connection circuit topology 30', and a common-source circuit topology 30" (hereinafter also referred to as a half-bridge 30, paralleled transistor connection 30', and a common-source circuit 30") may be integrated and implemented in discrete packages or power modules as part of the semiconductor power device 14 of the power system 10 to rectify, invert, convert, or otherwise manipulate electrical energy using a voltage-source gate driver 12 as shown in FIG. 1 that decouples controlling of a switching speed and a gate delay associated with the semiconductor power device 14.

As illustrated in FIGS. 3A to 3C, respectively, each of the half-bridge circuit topology 30, the paralleled transistor connection circuit topology 30', and the common-source circuit topology 30" comprise a first transistor and a second transistor wherein the first transistor and the second transistor may be one of metal oxide semiconductor field-effect transistors (MOSFETs), insulated gate bipolar transistors (IGBTs), junction-gate field-effect transistors (JFETs), high electron mobility transistors (HEMTs), or the like.

FIG. 3A illustrates an exemplary a half-bridge circuit topology 30. The half-bridge circuit topology 30 (also referred to as the half-bridge 30) comprises high side power semiconductor switching device labeled HIGH SIDE including a first MOSFET device M1 and low side power semiconductor switching device labeled LOW SIDE including a second MOSFET device M2, a power source in the form of a bulk capacitor bank DC LINK, and a decoupling capacitor Cd that is electrically coupled between a positive direct current (DC) busbar DC+ and a negative DC busbar DC−. The first MOSFET device M1 comprises a first gate terminal G1, a first source terminal S1, and a first drain terminal D1, and the second MOSFET device M2 comprises a second gate terminal G2, a second source terminal S2, and a second drain terminal D2. As shown, the first drain terminal D1 of the first MOSFET device M1 connects to the positive DC busbar DC+, the second source terminal S2 of the second MOSFET device M2 connects to the negative DC busbar DC−, and the first source terminal S1 of the first MOSFET device M1 connects to the second drain terminal D2 of the second MOSFET device M2 to form a phase node N1 having a phase terminal T1 connected thereto. This configuration is commonly used in various topologies including, but not limited to, multi-level converters, current source inverters, solid-state circuit breakers, or the like.

FIG. 3B shows the paralleled transistor connection circuit topology 30' wherein a first MOSFET device M1 and a second MOSFET device M2 are connected to form a common-source node N3 and a common-drain node N2. The first MOSFET device M1 includes a first gate terminal G1, a first source terminal S1, and a first drain terminal D1, and the second MOSFET device M2 includes a second gate terminal G2, a second source terminal S2, and a second drain terminal D2. As shown in FIG. 3B, the first drain terminal D1 of the first MOSFET device M1 and the second drain terminal D2 of the second MOSFET device M2 are electrically connected to form the common-drain node N2 and a common-drain input/output terminal T2. In a similar manner, the first source terminal S1 of the first MOSFET device M1 and the second source terminal S2 of the second MOSFET device M2 are electrically connected to form the common-source node N3 and a common-source input/output terminal T3. The paralleled transistor connection circuit topology 30' may be utilized in high-power applications wherein an individual transistor is unable to conduct a high current as required in high-power applications. For example, the semiconductor power device 14 as shown in FIG. 1 may further comprise the power MOSFETs M1 and M2 that are connected in parallel across each other, as shown in FIG. 3B. It is noted that a paralleled transistor connection, for example, the paralleled transistor connection circuit topology 30' as shown in FIG. 3B is particularly advantageous as it further increases a power level associated with a semiconductor power device 14 as shown in FIG. 1. In this regard, FIG. 2 illustrates multiple transistors that are connected in parallel as part of a semiconductor power devices 14', for example, in a discrete package. In this regard, a single shunt resistor $R_{GSNT}$ and a single shunt capacitor $C_{GSNT}$ may be used for the entirety of the semiconductor power devices 14' comprising a plurality of MOSFETS $Q3_1$ to $Q3_n$ that are connected in parallel. However, each of the plurality of MOSFETS $Q3_1$ to $Q3_n$ is provided with a respective split-gate resistor $R_{G1}$ to $R_{Gn}$ to avoid gate oscillation among the paralleled MOSFETS $Q3_1$ to $Q3_n$ forming part of the semiconductor power device 14'.

FIG. 3C illustrates the common-source circuit topology 30". As illustrated, the common-source transistor circuit topology 30" comprises a first MOSFET M1 having a first gate terminal G1, a first source terminal S1, and a first drain terminal D1 and a second MOSFET M2 having a second gate terminal G2, a second source terminal S2, and a second drain terminal D2. In this configuration, the first source S1 of the first MOSFET device M1 and the second source S2 of the second MOSFET device M2 are electrically connected to form a common-source node N4. Furthermore, the first drain D1 of the first MOSFET device M1 forms an upper input/output terminal T4, while the second drain D2 of the second MOSFET device M2 forms a lower input/output terminal T5. The upper input/output terminal T4 and the lower input/output terminal T5 may be coupled between a voltage supply (not shown) configured to provide a DC supply voltage and a load to form a bidirectional switch with an ability to block the current in both directions, providing an ON-state voltage or an OFF-state voltage. This configuration provides a voltage blocking capability in both directions, from the first drain terminal D1 to the second drain terminal D2, or from the second drain terminal D2 to the first drain terminal D1. Therefore, the common-source circuit topology 30" is particularly advantageous as it enables various power conversion functions.

Figure 4A:
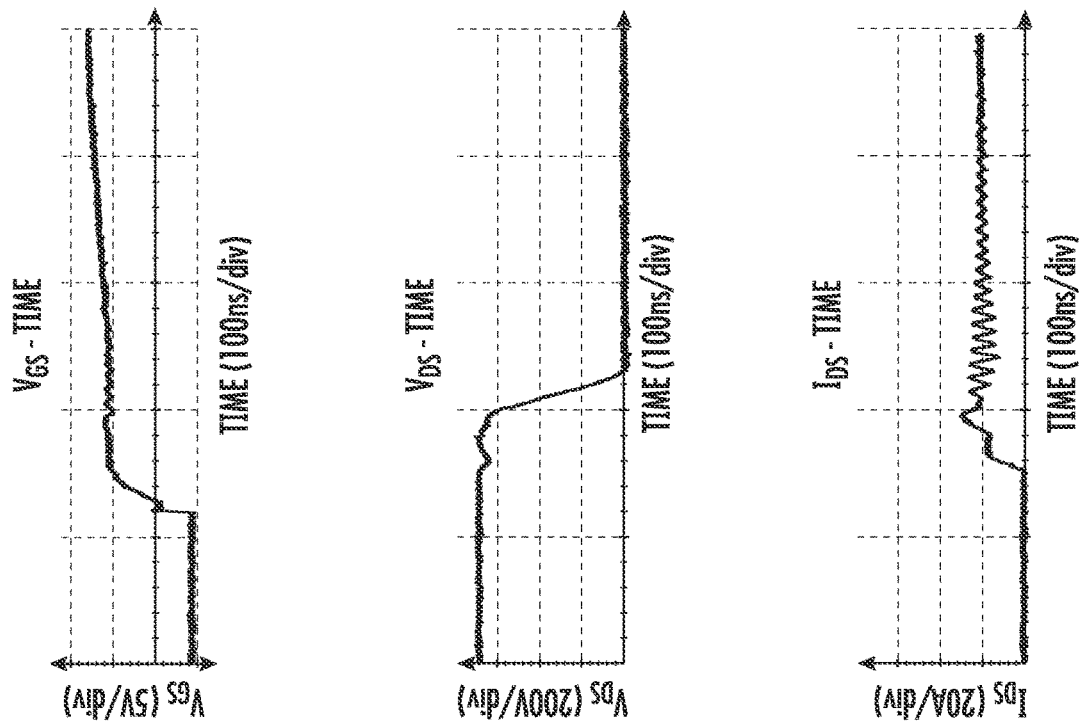
FIGS. 4A and 4B are graphs showing voltage and current characteristics of the semiconductor power device of the power system, as shown in FIG. 1, having a shunt capacitor $C_{GSNT}$, and in the absence of a shunt resistor $R_{GSNT}$ ($R_{GSNT}$=0Ω).
Figure 4B:
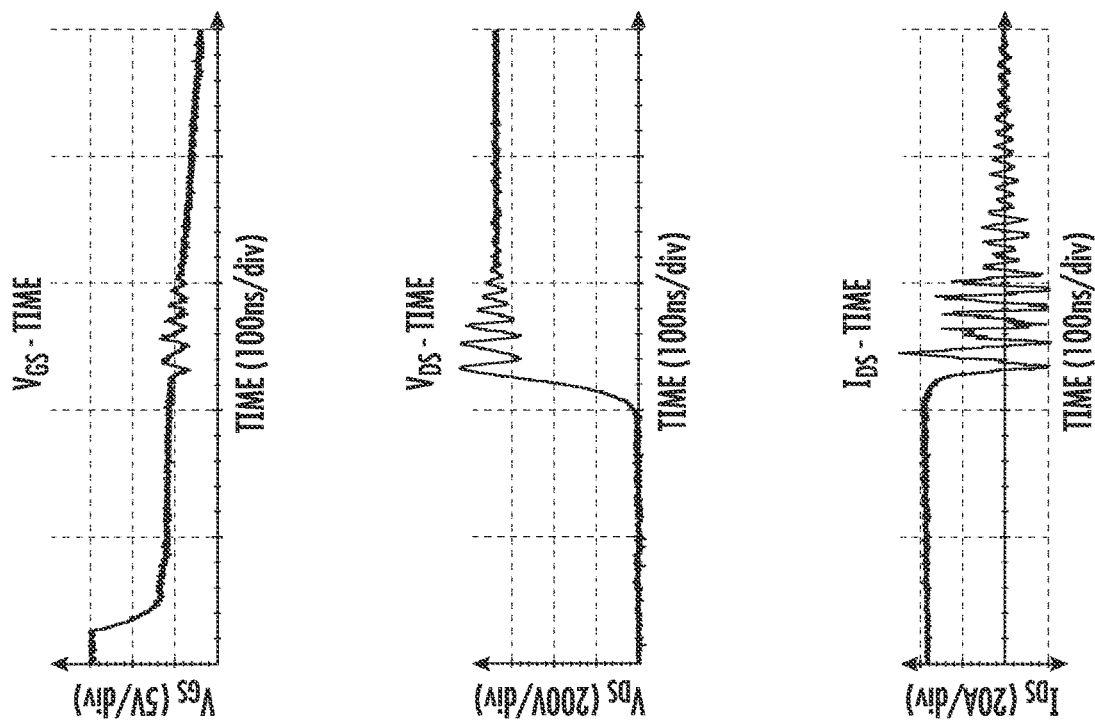

FIGS. 4A and 4B are graphs showing voltage and current characteristics of the semiconductor power device 14 of the power system 10, as shown in FIG. 1, having a shunt capacitor $C_{GSNT}$, and in the absence of a shunt resistor $R_{GSNT}$ ($R_{GSNT}$=0Ω). The power system 10 includes a voltage-source gate driver 12 coupled to the semiconductor power device 14 that is a discrete semiconductor device. However, the shunt capacitor ($C_{GSNT}$) in the absence of any shunt resistor ($R_{GSNT}$) connected thereto gives rise to oscillations during a turn-off and a turn-on of the semiconductor power device 14, as shown in FIGS. 4A and 4B, respectively. Elements as discussed in FIGS. 4A and 4B that were previously described in conjunction with FIGS. 1 to 3 are not described herein for brevity.

In this regard, each of the FIGS. 4A and 4B provides graphs of a gate-source voltage over time ($V_{GS}$-Time), a drain-source voltage over time ($V_{DS}$-Time), and a drain-source current over time ($I_{DS}$-Time) based on measurements obtained under a positive supply voltage $V_{DD}$ of 15V, a negative supply voltage $V_{EE}$ of −5V, and a bus voltage of 800V. The semiconductor power device 14 is a MOSFET and has a rated drain-source voltage $V_{GS}$ of 1200V, and a rated drain-source current $I_{DS}$ of 120A. Furthermore, the MOSFET as part of the semiconductor power device 14 has a drain-to-source on-state resistance Rds(ON) of 9 mΩ at 25° C., an input capacitance $C_{ISS}$ of 8.5 nF, a turn-on gate resistor $R_{G-ON}$ of 75Ω, a turn-off gate resistor $R_{G-OFF}$ of 75Ω, a series-split gate resistor $R_G$ of 0Ω, and a threshold voltage $V_{TH}$ that is 5V. Therefore, the shunt capacitor $C_{GSNT}$ is calculated to be 8.5 nF using equations (1) and (2) as provided above.

FIG. 4A is graphs showing voltage and current characteristics of the semiconductor power device 14 of the power system 10, as shown in FIG. 1, during a turn-off transition, wherein the power system 10 includes a shunt capacitor $C_{GSNT}$ without a shunt resistor $R_{GSNT}$ ($R_{GSNT}$=0Ω). The first graph shows a gate-source voltage $V_{GS}$ over time ($V_{GS}$-Time) as the semiconductor power device 14 turns off. The second graph shows a drain-source voltage $V_{DS}$ over time ($V_{DS}$-Time) as the semiconductor power device 14 turns off. The third graph shows a drain-source current $I_{DS}$ over time ($I_{DS}$-Time) as the semiconductor power device 14 turns off. In this regard, a turn-off time ($t_{off}$) is measured and approximately equals 200 ns, a turn-off delay time ($t_{d(off)}$) is measured and approximately equals 180 ns, a turn-off current rate (di/$dt_{off}$) is measured and approximately equals 4 A/ns, a turn-off voltage rate (dv/$dt_{off}$) is measured and approximately equals 20V/ns, and a voltage rise time ($t_r$) is measured and approximately equals 20 ns. A high degree of oscillation is associated with the gate-source voltage $V_{GS}$, the drain-source voltage $V_{GS}$, and the drain-source current $I_{DS}$ as observed and is due to the absence of any shunt resistor $R_{GSNT}$.

FIG. 4B is graphs showing voltage and current characteristics of the semiconductor power device 14 of the power system 10, as shown in FIG. 1, during a turn-on transition, wherein the power system 10 includes a shunt capacitor $C_{GSNT}$ without a shunt resistor $R_{GSNT}$ ($R_{GSNT}$=002). The first graph shows a gate-source voltage $V_{GS}$ over time ($V_{GS}$-Time) as the semiconductor power device 14 turns on. The second graph shows a drain-source voltage $V_{DS}$ over time ($V_{DS}$-Time) as the semiconductor power device 14 turns on. The third graph shows a drain-source current $I_{DS}$ over time ($I_{DS}$-Time) as the semiconductor power device 14 turns on. In this regard, a turn-on time ($t_{on}$) is measured and approximately equals 120 ns, a turn-on delay time ($t_{d(on)}$) is measured and approximately equals 80 ns, a turn-on current rate ($di/dt_{on}$) is measured and approximately equals 1 A/ns, a turn-on voltage rate ($dv/dt_{on}$) is measured and approximately equals 15V/ns, and a drain-source voltage ($V_{DS}$) fall time ($t_r$) is measured and approximately equals 20 ns. As shown, a high degree of oscillation is associated with the gate-source voltage $V_{GS}$, the drain-source voltage $V_{DS}$, and the drain-source current $I_{DS}$ and is due to the absence of a shunt resistor $R_{GSNT}$. Therefore, to sustain stability, a shunt resistor ($R_{GSNT}$) may be used (as shown in FIGS. 5A and 5B) to prevent gate oscillations in the semiconductor power device 14.

Figure 5A:
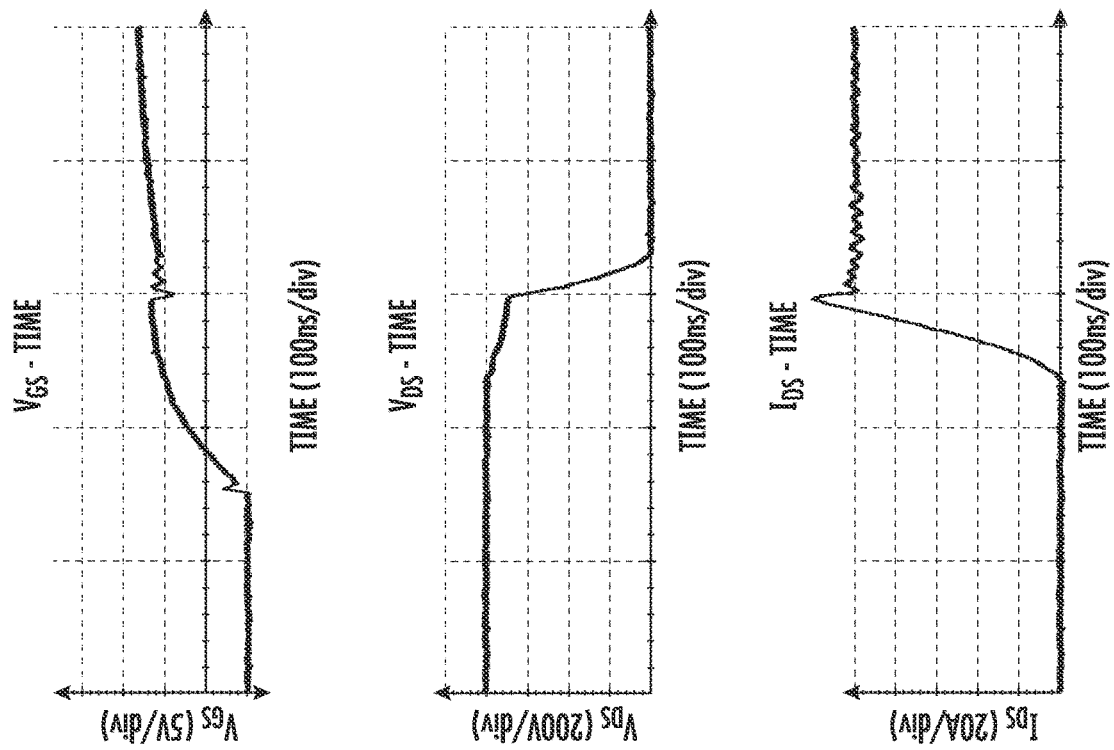
FIGS. 5A and 5B are graphs showing voltage and current characteristics of the semiconductor power device (that is a discrete device) of the power system, as shown in FIG. 1, having a shunt capacitor $C_{GSNT}$ and a shunt resistor $R_{GSNT}$.
Figure 5B:
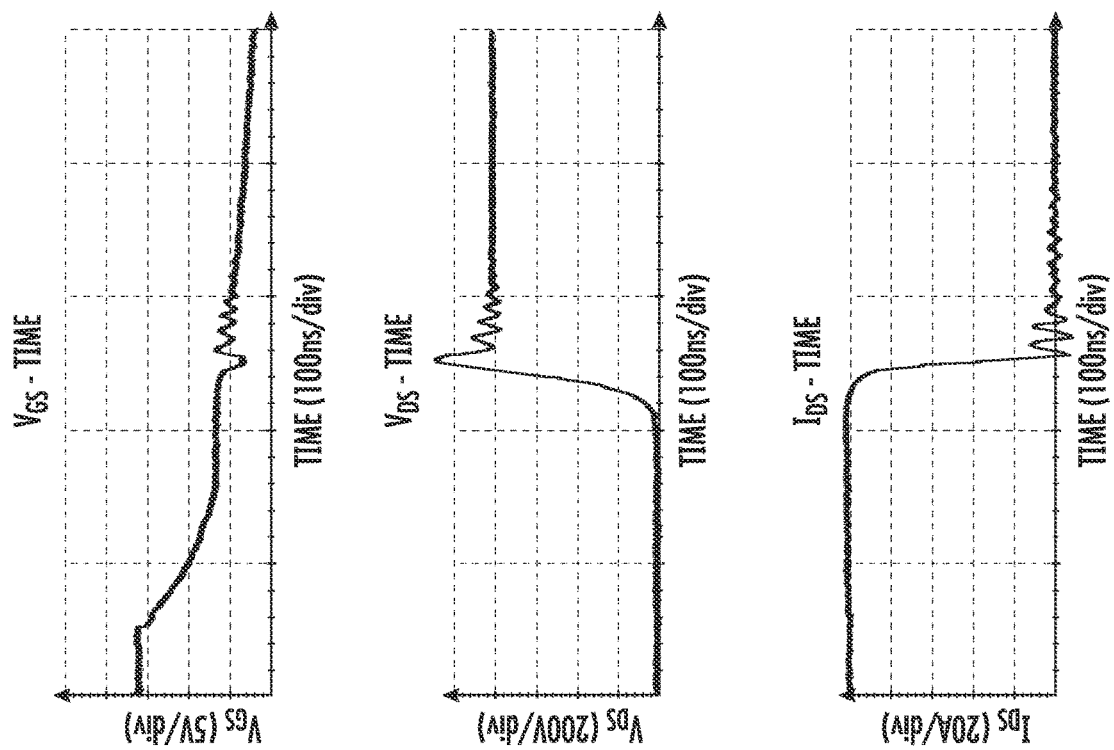

FIGS. 5A and 5B are graphs showing voltage and current characteristics of the semiconductor power device 14 (that is a discrete device) of the power system 10, as shown in FIG. 1, having a shunt capacitor $C_{GSNT}$ and a shunt resistor $R_{GSNT}$. The power system 10 includes a voltage-source gate driver 12 coupled to the semiconductor power device 14 that is a discrete semiconductor device. Elements as discussed in FIGS. 5A and 5B that were previously described in conjunction with FIGS. 1 to 3 are not described herein for brevity.

In this regard, each of the FIGS. 5A and 5B provide graphs of a gate-source voltage over time ($V_{GS}$-Time), a drain-source voltage over time ($V_{DS}$-Time), and a drain-source current over time ($I_{DS}$-Time) based on measurements obtained under a positive supply voltage $V_{DD}$ of 15V, a negative supply voltage $V_{EE}$ of −5V, and a bus voltage of 800V. The semiconductor power device 14 is a MOSFET and has a rated drain-source voltage $V_{GS}$ of 1200V, and a rated drain-source current $I_{DS}$ of 120A. Furthermore, the MOSFET as part of the semiconductor power device 14 has a drain-to-source on-state resistance Rds(ON) of 9 mΩ at 25° C., a turn-on gate resistor $R_{G-ON}$ of 75Ω, a turn-off gate resistor $R_{G-OFF}$ of 75Ω, a series-split gate resistor $R_G$ of 0Ω, an input capacitance $C_{ISS}$ of 8.5 nF, and a threshold voltage $V_{TH}$ that is 5V. Therefore, the shunt capacitor $C_{GSNT}$ is calculated using equations (1) and (2), as provided above, and equals 8.5 nF. Accordingly, a value of the shunt resistor $R_{GSNT}$ is determined to be 22Ω. As shown, oscillations are greatly reduced in FIGS. 5A and 5B compared with FIGS. 4A and 4B during turn-off and turn-on transitions. This is due to the introduction of the shunt resistor $R_{GSNT}$ that is sufficiently large enough to dampen the oscillations.

FIG. 5A is graphs showing voltage and current characteristics of the semiconductor power device 14 of the power system 10, as shown in FIG. 1, having a shunt capacitor $C_{GSNT}$ and a shunt resistor $R_{GSNT}$, and during a turn-off transition. The first graph shows a gate-source voltage $V_{GS}$ over time ($V_{GS}$-Time) as the semiconductor power device 14 turns off. The second graph shows a drain-source voltage $V_{GS}$ over time ($V_{DS}$-Time) as the semiconductor power device 14 turns off. The third graph shows a drain-source current $I_{DS}$ over time ($I_{DS}$-Time) as the semiconductor power device 14 turns off. In this regard, a turn-off time ($t_{off}$) is measured and approximately equals 200 ns, a turn-off delay time ($t_{d(off)}$) is measured and approximately equals 180 ns, a turn-off current rate ($di/dt_{off}$) is measured and approximately equals 4 A/ns, a turn-off voltage rate ($dv/dt_{off}$) is measured and approximately equals 20V/ns, and a voltage rise time ($t_r$) is measured and approximately equals 20 ns. Therefore, it is shown that the inclusion of the shunt resistor $R_{GSNT}$ helps reduce and eliminate the oscillation.

FIG. 5B is graphs showing voltage and current characteristics of the semiconductor power device 14 of the power system 10, as shown in FIG. 1, having a shunt capacitor $C_{GSNT}$ and a shunt resistor $R_{GSNT}$, and during a turn-on transition. The first graph shows a gate-source voltage $V_{GS}$ over time ($V_{GS}$-Time) as the semiconductor power device 14 turns on. The second graph shows a drain-source voltage $V_{GS}$ over time ($V_{GS}$-Time) as the semiconductor power device 14 turns on. The third graph shows a drain-source current $I_{DS}$ over time ($I_{DS}$-Time) as the semiconductor power device 14 turns on. In this regard, a turn-on time ($t_{on}$) is measured and approximately equals 120 ns, a turn-on delay time ($t_{d(on)}$) is measured and approximately equals 80 ns, a turn-on current rate ($di/dt_{on}$) is measured and approximately equals 1 A/ns, a turn-on voltage rate ($dv/dt_{on}$) is measured and approximately equals 15V/ns, and a drain-source voltage ($V_{DS}$) fall time ($t_f$) is measured and approximately equals 20 ns.

Figure 6B:
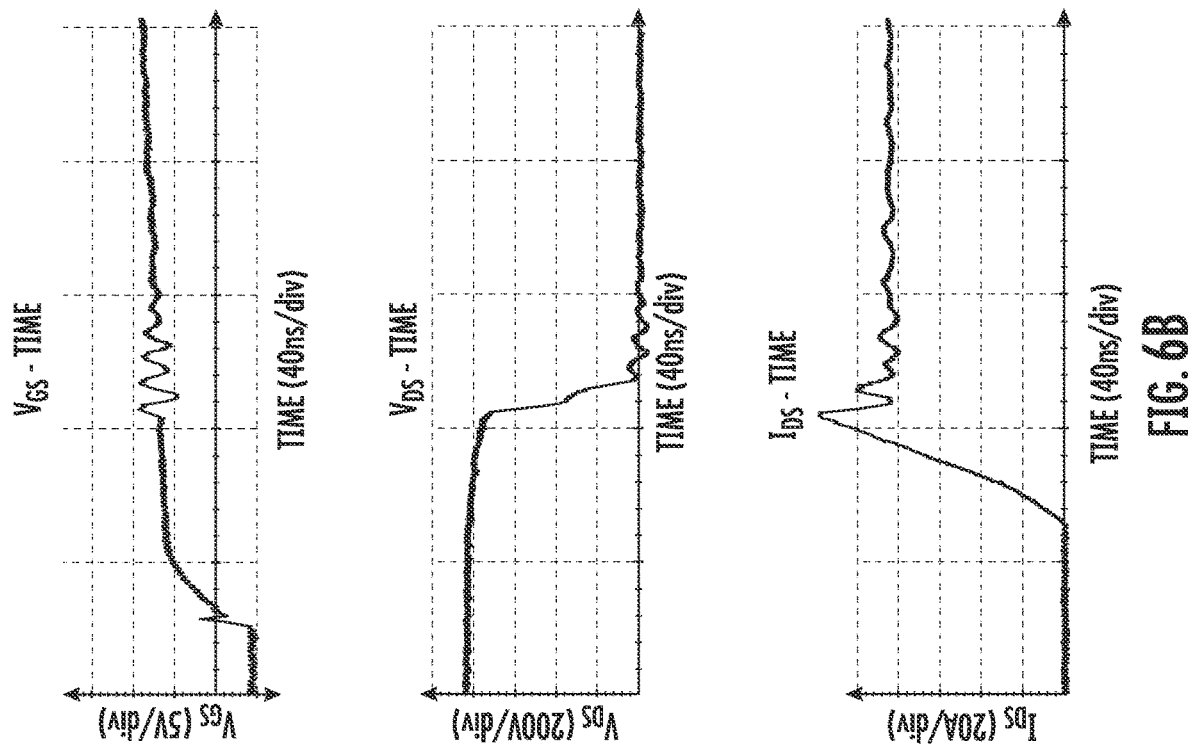
FIGS. 6A and 6B are graphs showing voltage and current characteristics of the semiconductor power device (that is a half-bridge 30 power module) of the power system, as shown in FIG. 1, and having a shunt capacitor $C_{GSNT}$, a shunt resistor $R_{GSNT}$, and a series-split gate resistor $R_G$.
Figure 6A:
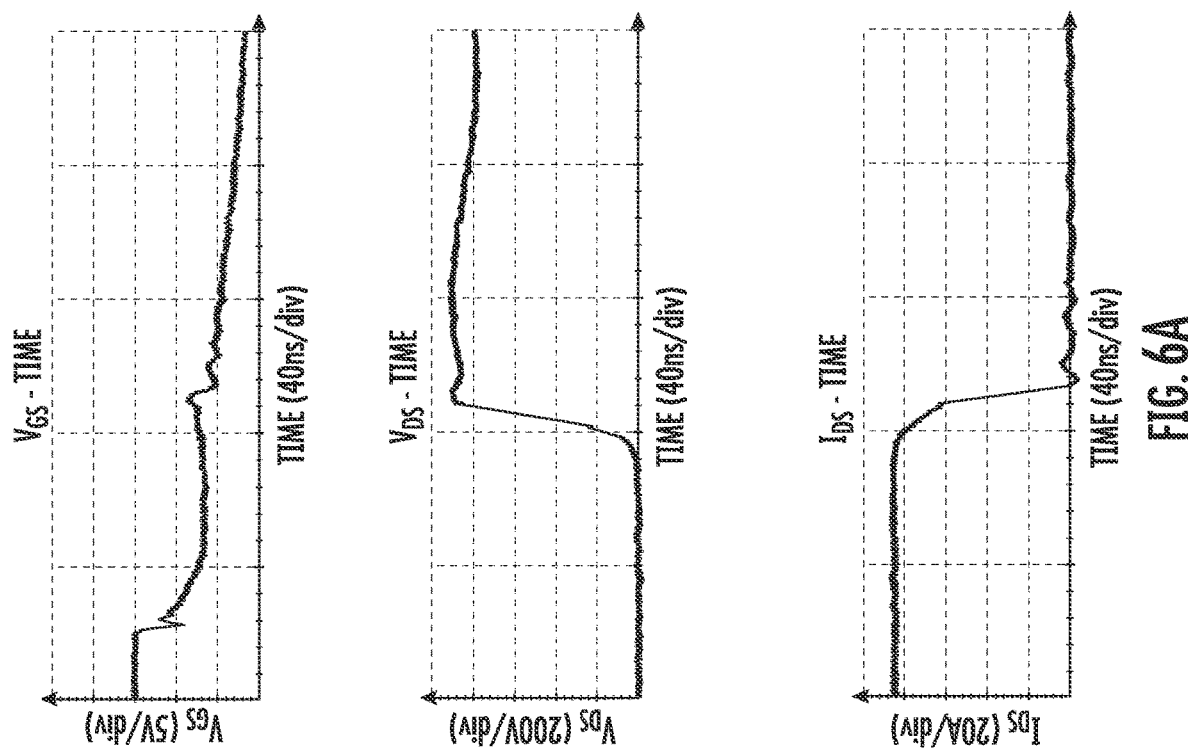

FIGS. 6A and 6B are graphs showing voltage and current characteristics of a semiconductor power device 14 (that is a half-bridge 30 power module) of the power system 10, as shown in FIG. 1, and having a shunt capacitor $C_{GSNT}$, a shunt resistor $R_{GSNT}$, and a series-split gate resistor $R_G$. The power system 10 includes a voltage-source gate driver 12 coupled to the semiconductor power device 14 that is the half-bridge 30 power module as shown in FIG. 3A. Elements as discussed in FIGS. 6A and 6B that were previously described in conjunction with FIGS. 1 to 3 are not described herein for brevity.

In this regard, each of the FIGS. 6A and 6B provide graphs of a gate-source voltage over time ($V_{GS}$-Time), a drain-source voltage over time ($V_{DS}$-Time), and a drain-source current over time ($I_{DS}$-Time) based on measurements obtained under a positive supply voltage $V_{DD}$ of 15V, a negative supply voltage $V_{EE}$ of −5V, and a bus voltage of 800V is used. The semiconductor power device 14 is a half-bridge 30 and is a rated drain-source voltage $V_{DS}$ of 1200V, and a rated drain-source current $I_{DS}$ of 50A. Furthermore, the half-bridge power module as part of the semiconductor power device 14 has a drain-to-source on-state resistance Rds(ON) of 19 mΩ at 25° C., a turn-on gate resistor $R_{G-ON}$ of 75Ω, a turn-off gate resistor $R_{G-OFF}$ of 75Ω, a series-split gate resistor $R_G$ of 0Ω, an input capacitance $C_{ISS}$ of 3 nF, and a threshold voltage $V_{TH}$ that is 5V. Therefore, the shunt capacitor $C_{GSNT}$ is calculated using equations (1) and (2), as provided above, and equals 3 nF. Accordingly, a value of the shunt resistor $R_{GSNT}$ is determined to be 150Ω. As shown, the shunt capacitor $C_{GSNT}$ and the shunt resistor $R_{GSNT}$ mitigate a longer gate delay and higher switching losses that may be caused by the introduction of a series-split gate resistor $R_G$. Therefore, the series-split gate resistor $R_G$ may be introduced such that the semiconductor power device 14 meets electromagnetic compatibility and electromagnetic interference industry standards while avoiding oscillations.

FIG. 6A is graphs showing voltage and current characteristics of the semiconductor power device 14 of the power system 10, as shown in FIG. 1, during a turn-off transition, and having a shunt capacitor $C_{GSNT}$, a shunt resistor $R_{GSNT}$, and a series-split gate resistor $R_G$. The first graph shows a gate-source voltage $V_{GS}$ over time ($V_{GS}$-Time) as the semiconductor power device 14 turns off. The second graph shows a drain-source voltage $V_{GS}$ over time ($V_{DS}$-Time) as the semiconductor power device 14 turns off. The third graph shows a drain-source current $I_{DS}$ over time ($I_{DS}$-Time) as the semiconductor power device 14 turns off. In this regard, a turn-off time ($t_{off}$) is measured and approximately equals 68 ns, a turn-off delay time ($t_{d(off)}$) is measured and approximately equals 48 ns, a turn-off current rate ($di/dt_{off}$) is measured and approximately equals 6 A/ns, a turn-off voltage rate ($dv/dt_{off}$) is measured and approximately equals 37.5V/ns, and a voltage rise time ($t_r$) is measured and approximately equals 20 ns.

FIG. 6B is graphs showing voltage and current characteristics of the semiconductor power device 14 of the power system 10, as shown in FIG. 1, during a turn-on transition, and having a shunt capacitor $C_{GSNT}$, a shunt resistor $R_{GSNT}$, and a series-split gate resistor $R_G$. The first graph shows a gate-source voltage $V_{GS}$ over time ($V_{GS}$-Time) as the semiconductor power device 14 turns on. The second graph shows a drain-source voltage $V_{GS}$ over time ($V_{DS}$-Time) as the semiconductor power device 14 turns on. The third graph shows a drain-source current $I_{DS}$ over time ($I_{DS}$-Time) as the semiconductor power device 14 turns on. In this regard, a turn-on time ($t_{on}$) is measured and approximately equals 72 ns, a turn-on delay time ($t_{d(on)}$) is measured and approximately equals 56 ns, a turn-on current rate ($di/dt_{on}$) is measured and approximately equals 2 A/ns, a turn-on voltage rate ($dv/dt_{on}$) is measured and approximately equals 37.5V/ns, and a voltage fall time ($t_r$) is measured and approximately equals 16 ns.

Figure 7A:
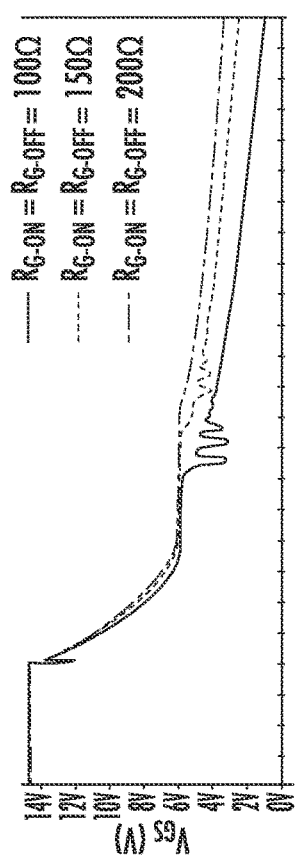
FIGS. 7A and 7B are graphs showing voltage and current characteristics of the semiconductor power device of the power system, as shown in FIG. 1, and generated using different values of a turn-on gate resistor $R_{G-ON}$ and a turn-off gate resistor $R_{G-OFF}$.
Figure 7A:
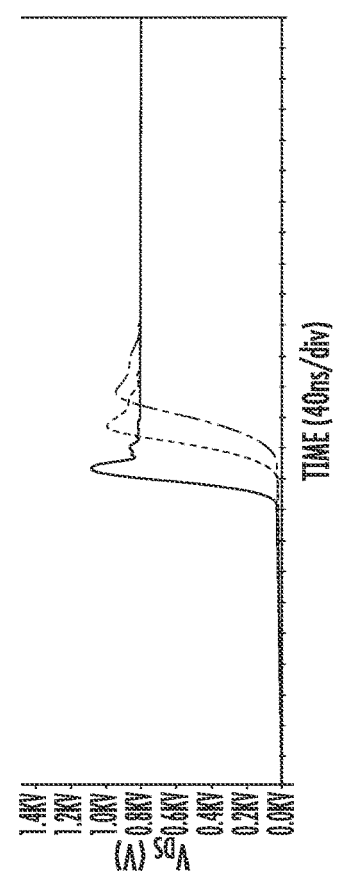
Figure 7A:
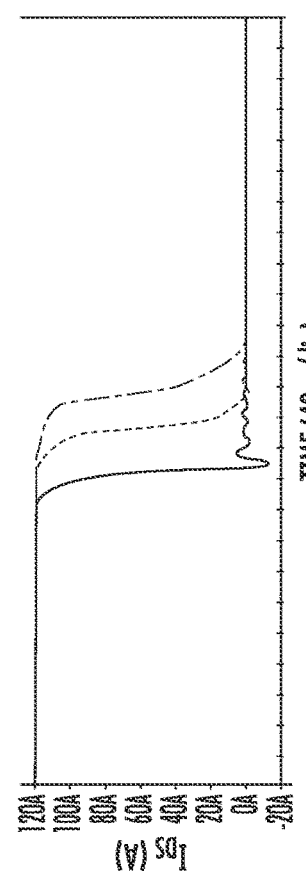
Figure 7B:
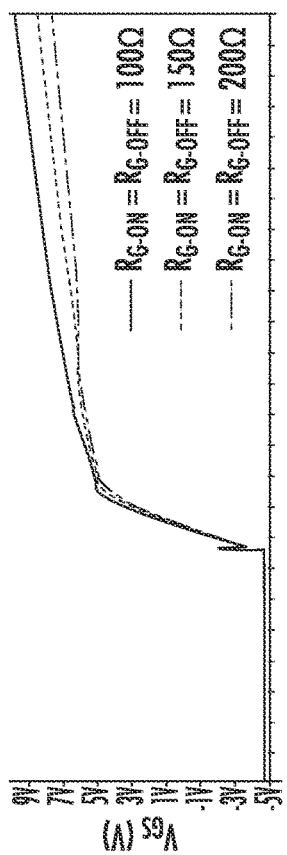
Figure 7B:
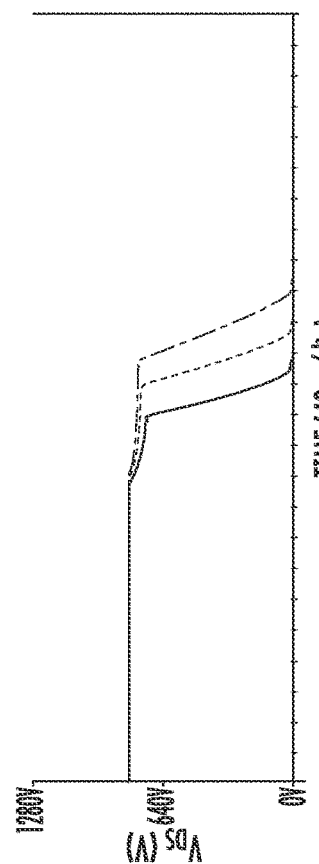
Figure 7B:
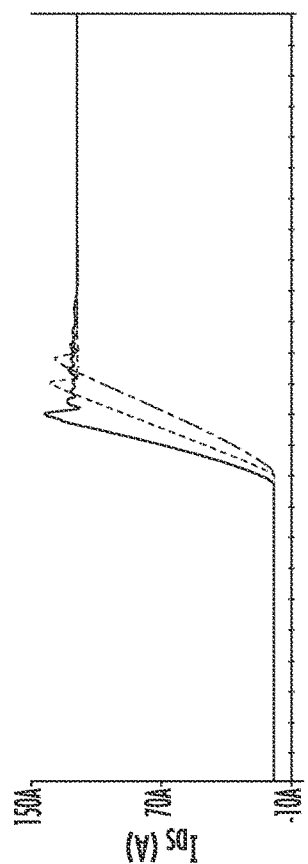

FIGS. 7A and 7B are graphs showing voltage and current characteristics of the semiconductor power device 14 of the power system 10, as shown in FIG. 1, and generated using different values of a turn-on gate resistor $R_{G-ON}$ and a turn-off gate resistor $R_{G-OFF}$. The power system 10 includes a voltage-source gate driver 12 coupled to the semiconductor power device 14 that is a discrete semiconductor device. Elements as discussed in FIGS. 7A and 7B that were previously described in conjunction with FIGS. 1 to 3 are not described herein for brevity.

In this regard, each of the FIGS. 7A and 7B provide graphs of a gate-source voltage over time ($V_{GS}$-Time), a drain-source voltage over time ($V_{DS}$-Time), and a drain-source current over time ($I_{DS}$-Time) based on measurements obtained under a positive supply voltage $V_{DD}$ of 15V, a negative supply voltage $V_{EE}$ of −5V, and a bus voltage of 800V is used. The semiconductor power device 14 is a MOSFET and has a rated drain-source voltage $V_{GS}$ of 1200V, and a rated drain-source current $I_{DS}$ of 120A. Furthermore, the MOSFET as part of the semiconductor power device 14 has a drain-to-source on-state resistance Rds(ON) of 9 mΩ at 25° C., an input capacitance $C_{ISS}$ of 8.5 nF, and a threshold voltage $V_{TH}$ that is 5V. Therefore, the shunt capacitor $C_{GSNT}$ is calculated using equations (1) and (2), as provided above, and equals 8.5 nF. Accordingly, a value of the shunt resistor $R_{GSNT}$ is determined to be 22Ω. In this regard, three graphs are generated for each of the $V_{GS}$-Time, $V_{GS}$-Time, and $I_{DS}$-Time, wherein each of the three graphs is based on one of the three values of the turn-on gate resistor $R_{G-ON}$ and the turn-off gate resistor $R_{G-OFF}$ having different values ($R_{G-ON}=R_{G-OFF}=100Ω$, $R_{G-ON}=R_{G-OFF}=150Ω$, and $R_{G-ON}=R_{G-OFF}=200Ω$). As shown, the shunt capacitor $C_{GSNT}$ and the shunt resistor $R_{GSNT}$ mitigate a longer gate delay.

FIG. 7A is graphs showing voltage and current characteristics of the semiconductor power device 14 of the power system 10, as shown in FIG. 1, during a turn-off transition, and generated using a turn-on gate resistor $R_{G-ON}$ and a turn-off gate resistor $R_{G-OFF}$ having different values ($R_{G-ON}=R_{G-OFF}=100Ω$, $R_{G-ON}=R_{G-OFF}=150Ω$, and $R_{G-ON}=R_{G-OFF}=200Ω$). The first graph shows a gate-source voltage $V_{GS}$ over time ($V_{GS}$-Time) as the semiconductor power device 14 turns off. The second graph shows a drain-source voltage $V_{GS}$ over time ($V_{DS}$-Time) as the semiconductor power device 14 turns off. The third graph shows a drain-source current $I_{DS}$ over time ($I_{DS}$-Time) as the semiconductor power device 14 turns off. In this regard, for the turn-on gate resistor $R_{G-ON}$ and the turn-off gate resistor $R_{G-OFF}$ having a value of $R_{G-ON}=R_{G-OFF}=100Ω$, a turn-off time ($t_{off}$) is measured and approximately equals 240 ns, a turn-off delay time ($t_{d(off)}$) is measured and approximately equals 200 ns, a turn-off current rate ($di/dt_{off}$) is measured and approximately equals 6 A/ns, a turn-off voltage rate ($dv/dt_{off}$) is measured and approximately equals 26V/ns, and a voltage rise time ($t_r$) is measured and approximately equals 30 ns. Furthermore, for the turn-on gate resistor $R_{G-ON}$ and the turn-off gate resistor $R_{G-OFF}$ having a value of $R_{G-ON}=R_{G-OFF}=150Ω$, a turn-off time ($t_{off}$) is measured and approximately equals 280 ns, a turn-off delay time ($t_{d(off)}$) is measured and approximately equals 240 ns, a turn-off current rate ($di/dt_{off}$) is measured and approximately equals 2.5 A/ns, a turn-off voltage rate ($dv/dt_{off}$) is measured and approximately equals 16V/ns, and a voltage rise time ($t_r$) is measured and approximately equals 50 ns. Lastly, for the turn-on gate resistor $R_{G-ON}$ and the turn-off gate resistor $R_{G-OFF}$ having a value of $R_{G-ON}=R_{G-OFF}=200Ω$, a turn-off time ($t_{off}$) is measured and approximately equals 320 ns, a turn-off delay time ($t_{d(off)}$) is measured and approximately equals 280 ns, a turn-off current rate ($di/dt_{off}$) is measured and approximately equals 1.6 A/ns, a turn-off voltage rate ($dv/dt_{off}$) is measured and approximately equals 12V/ns, and a voltage rise time ($t_r$) is measured and approximately equals 70 ns.

FIG. 7B is graphs showing voltage and current characteristics of the discrete semiconductor power device 14 of the power system 10, as shown in FIG. 1, during a turn-on transition, and generated using a turn-on gate resistor $R_{G-ON}$ and a turn-off gate resistor $R_{G-OFF}$ having different values ($R_{G-ON}=R_{G-OFF}=100Ω$, $R_{G-ON}=R_{G-OFF}=150Ω$, and $R_{G-ON}=R_{G-OFF}=200Ω$). The first graph shows a gate-source voltage $V_{GS}$ over time ($V_{GS}$-Time) as the semiconductor power device 14 turns on. The second graph shows a drain-source voltage $V_{GS}$ over time ($V_{DS}$-Time) as the semiconductor power device 14 turns on. The third graph shows a drain-source current $I_{DS}$ over time ($I_{DS}$-Time) as the semiconductor power device 14 turns on. In this regard, for the turn-on gate resistor $R_{G-ON}$ and the turn-off gate resistor $R_{G-OFF}$ having a value of $R_{G-ON}=R_{G-OFF}=100Ω$, a turn-on time ($t_{on}$) is measured and approximately equals 240 ns, a turn-on delay time ($t_{d(on)}$) is measured and approximately equals 160 ns, a turn-on current rate ($di/dt_{on}$) is measured and approximately equals 1.5 A/ns, a turn-on voltage rate ($dv/dt_{on}$) is measured and approximately equals 15V/ns, and a voltage fall time ($t_r$) is measured and approximately equals 40 ns. Furthermore, for the turn-on gate resistor $R_{G-ON}$ and the turn-off gate resistor $R_{G-OFF}$ having a value of $R_{G-ON}=R_{G-OFF}=150Ω$, a turn-on time ($t_{on}$) is measured and approximately equals 280 ns, a turn-on delay time ($t_{d(on)}$) is measured and approximately equals 200 ns, a turn-on current rate ($di/dt_{on}$) is measured and approximately equals 1 A/ns, a turn-on voltage rate ($dv/dt_{on}$) is measured and approximately equals 12V/ns, and a voltage fall time ($t_r$) is measured and approximately equals 50 ns. Lastly, for the turn-on gate resistor $R_{G-ON}$ and the turn-off gate resistor $R_{G-OFF}$ having a value of $R_{G-ON}=R_{G-OFF}=200\Omega$, a turn-on time ($t_{on}$) is measured and approximately equals 320 ns, a turn-on delay time ($t_{d(on)}$) is measured and approximately equals 240 ns, a turn-on current rate ($di/dt_{on}$) is measured and approximately equals 0.75 A/ns, a turn-on voltage rate ($dv/dt_{on}$) is measured and approximately equals 10V/ns, and a voltage fall time ($t_r$) is measured and approximately equals 60 ns.

Figure 8A:
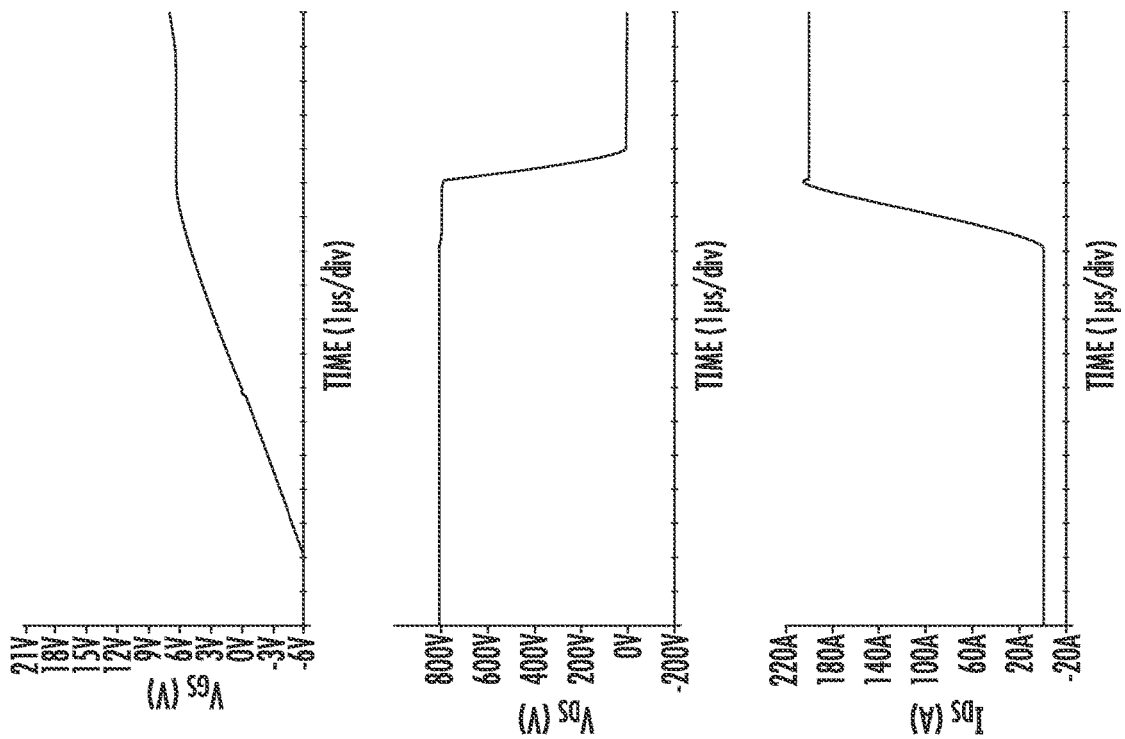
FIGS. 8A and 8B are graphs showing voltage and current characteristics of the semiconductor power device of the power system, as shown in FIG. 1, in the absence of a shunt capacitor $C_{GSNT}$ and a shunt resistor $R_{GSNT}$, and wherein the discrete semiconductor power device comprises electrical characteristics that are suitable for slow-switching applications.
Figure 8B:
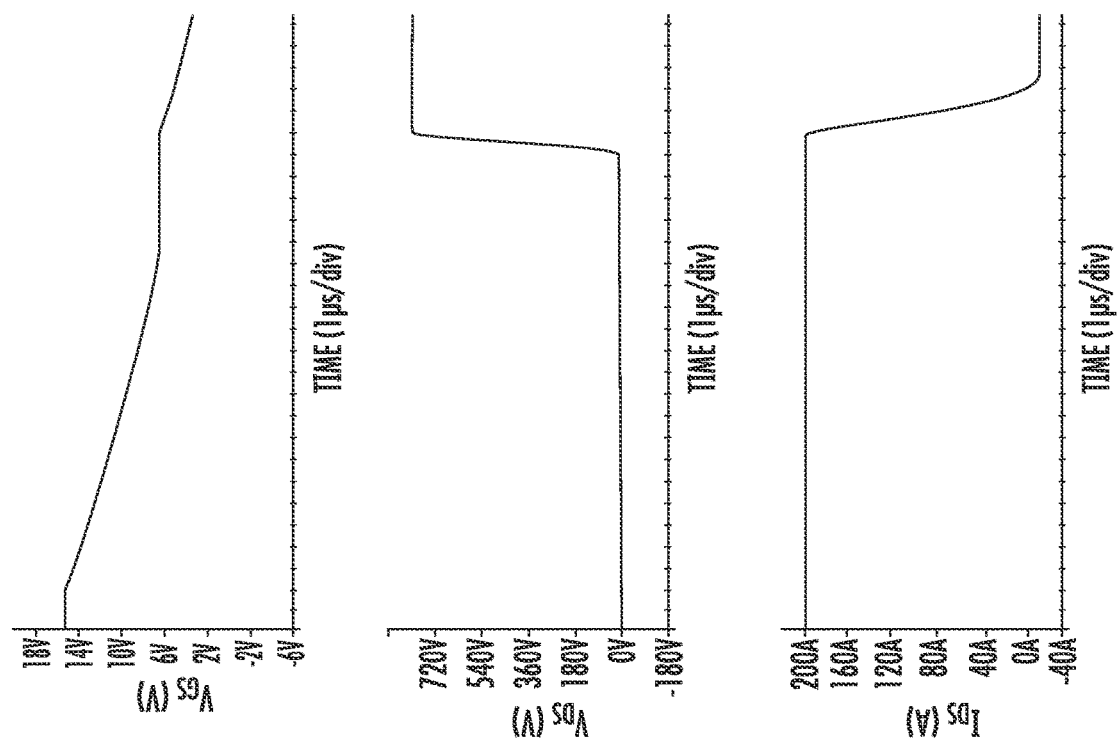

FIGS. 8A and 8B are graphs showing voltage and current characteristics of the semiconductor power device 14 of the power system 10, as shown in FIG. 1, in the absence of a shunt capacitor $C_{GSNT}$ and a shunt resistor $R_{GSNT}$, and wherein the discrete semiconductor power device 14 comprises electrical characteristics that are suitable for slow-switching applications such as circuit breakers, or the like. The power system 10 includes a voltage-source gate driver 12 coupled to the semiconductor power device 14 that is a discrete semiconductor device and is suitable for slow-switching applications such as solid-state circuit breakers. Elements as discussed in FIGS. 8A and 8B that were previously described in conjunction with FIGS. 1 to 3 are not described herein for brevity.

In this regard, each of the FIGS. 8A and 8B provides graphs of a gate-source voltage over time ($V_{GS}$-Time), a drain-source voltage over time ($V_{DS}$-Time), and a drain-source current over time ($I_{DS}$-Time) based on measurements obtained under a positive supply voltage $V_{DD}$ of 15V, a negative supply voltage $V_{EE}$ of −6V, and a bus voltage of 800V. The semiconductor power device 14 is a MOSFET and has a rated drain-source voltage $V_{GS}$ of 1200V, and a rated drain-source current $I_{DS}$ of 120A. Furthermore, the MOSFET as part of the semiconductor power device 14 has a drain-to-source on-state resistance Rds(ON) of 9 mΩ at 25° C., a turn-on gate resistor $R_{G-ON}$ of 1.5 kΩ, a turn-off gate resistor $R_{G-OFF}$ of 3 kΩ, a series-split gate resistor $R_G$ of 0Ω, an input capacitance $C_{ISS}$ of 8.5 nF, and a threshold voltage $V_{TH}$ that is 5V.

FIG. 8A is graphs showing voltage and current characteristics of the semiconductor power device 14 of the power system 10, as shown in FIG. 1, during a turn-off transition, in the absence of a shunt capacitor $C_{GSNT}$ and a shunt resistor $R_{GSNT}$, and wherein the semiconductor power device 14 comprises electrical characteristics that are suitable for slow-switching applications. The first graph shows a gate-source voltage $V_{GS}$ over time ($V_{GS}$-Time) as the semiconductor power device 14 turns off. The second graph shows a drain-source voltage $V_{GS}$ over time ($V_{DS}$-Time) as the semiconductor power device 14 turns off. The third graph shows a drain-source current $I_{DS}$ over time ($I_{DS}$-Time) as the semiconductor power device 14 turns off. In this regard, a turn-off time ($t_{off}$) is measured and approximately equals 22 μs, a turn-off delay time ($t_{d(off)}$) is measured and approximately equals 21 μs, a turn-off current rate ($di/dt_{off}$) is measured and approximately equals 0.09 A/ns, a turn-off voltage rate ($dv/dt_{off}$) is measured and approximately equals 0.89V/ns, and a voltage rise time ($t_r$) is measured and approximately equals 1 μs.

FIG. 8B is graphs showing voltage and current characteristics of the discrete semiconductor power device 14 of the power system 10, as shown in FIG. 1, during a turn-on transition, in the absence of a shunt capacitor $C_{GSNT}$ and a shunt resistor $R_{GSNT}$, and wherein the semiconductor power device 14 comprises electrical characteristics that are suitable for slow-switching applications. The first graph shows a gate-source voltage $V_{GS}$ over time ($V_{GS}$-Time) as the semiconductor power device 14 turns on. The second graph shows a drain-source voltage $V_{GS}$ over time ($V_{DS}$-Time) as the semiconductor power device 14 turns on. The third graph shows a drain-source current $I_{DS}$ over time ($I_{DS}$-Time) as the semiconductor power device 14 turns on. In this regard, a turn-on time ($t_{on}$) is measured and approximately equals 12 μs, a turn-on delay time ($t_{d(on)}$) is measured and approximately equals 11 μs, a turn-on current rate ($di/dt_{on}$) is measured and approximately equals 0.13 A/ns, a turn-on voltage rate ($dv/dt_{on}$) is measured and approximately equals 0.93V/ns, and a voltage fall time ($t_r$) is measured and approximately equals 1 μs.

Figure 9B:
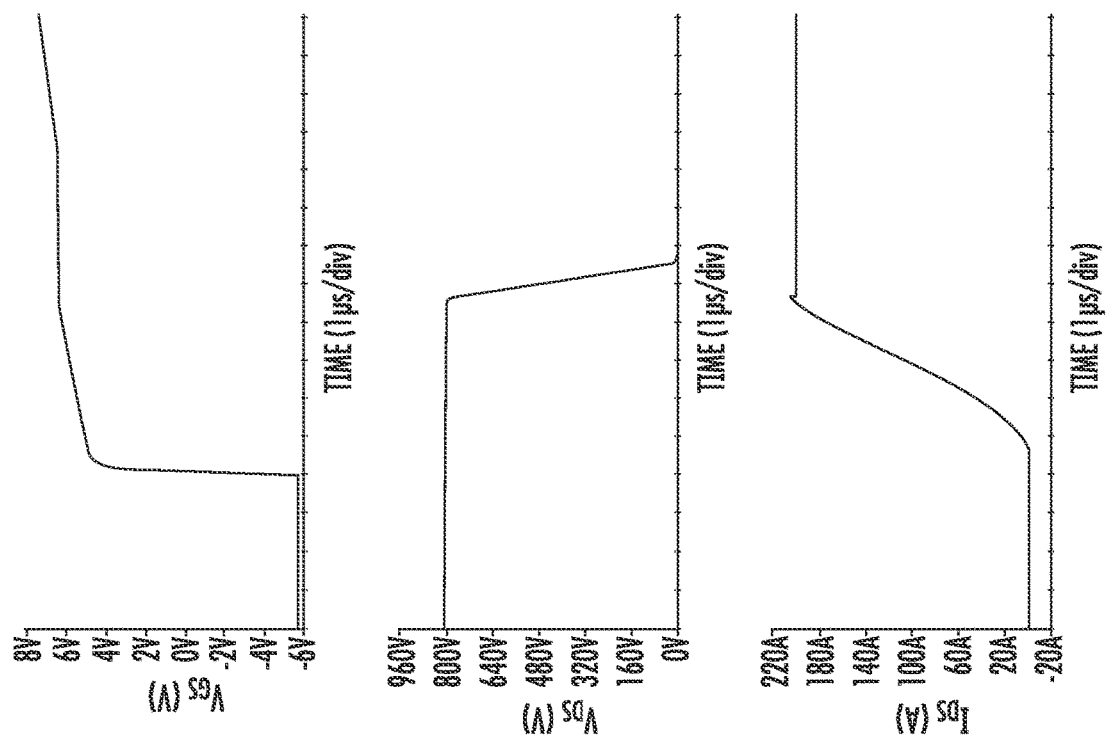
FIGS. 9A and 9B are graphs showing voltage and current characteristics of the semiconductor power device of the power system, as shown in FIG. 1, having a shunt capacitor $C_{GSNT}$ and a shunt resistor $R_{GSNT}$, and wherein the semiconductor power device comprises electrical characteristics that are suitable for slow-switching applications.
Figure 9A:
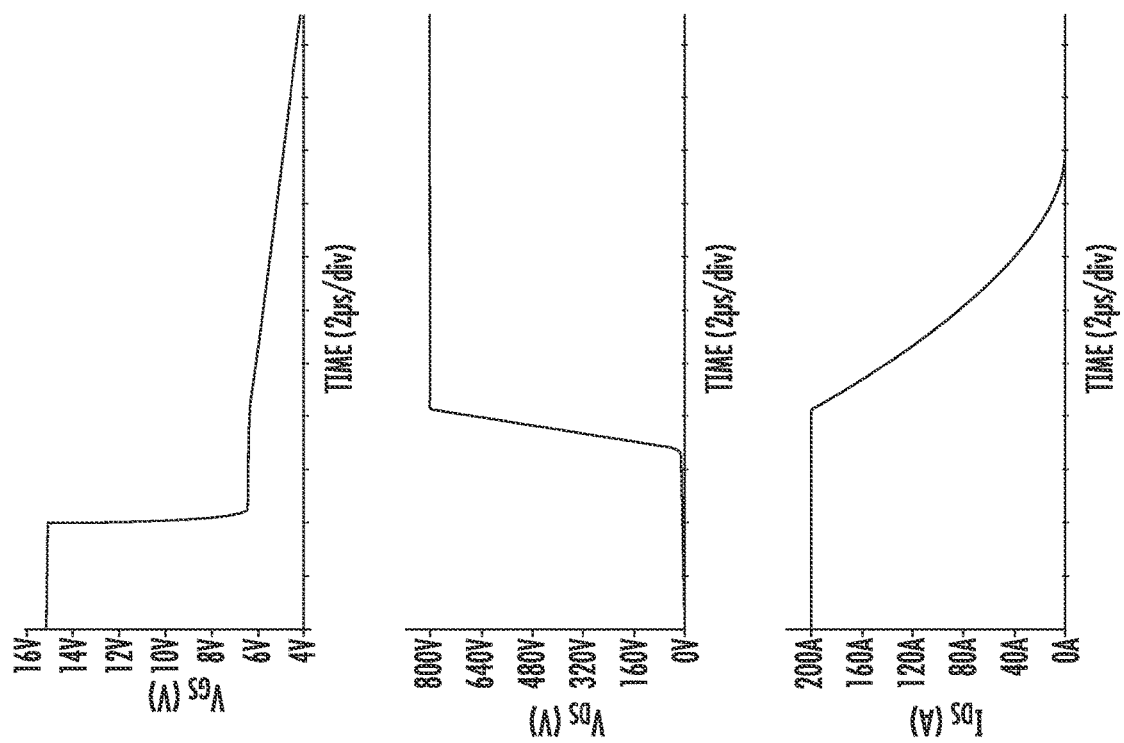

FIGS. 9A and 9B are graphs showing voltage and current characteristics of the semiconductor power device 14 of the power system 10, as shown in FIG. 1, having a shunt capacitor $C_{GSNT}$ and a shunt resistor $R_{GSNT}$, and wherein the semiconductor power device 14 comprises electrical characteristics that are suitable for slow-switching applications. The power system 10 includes a voltage-source gate driver 12 coupled to the semiconductor power device 14 that is a discrete semiconductor device and is suitable for slow-switching applications such as solid-state circuit breakers. Elements as discussed in FIGS. 9A and 9B that were previously described in conjunction with FIGS. 1 to 3 are not described herein for brevity.

In this regard, each of the FIGS. 9A and 9B provide graphs of a gate-source voltage over time ($V_{GS}$-Time), a drain-source voltage over time ($V_{DS}$-Time), and a drain-source current over time ($I_{DS}$-Time) based on measurements obtained under a positive supply voltage $V_{DD}$ of 15V, a negative supply voltage $V_{EE}$ of −6V, and a bus voltage of 800V is used. The semiconductor power device 14 is a MOSFET and has a rated drain-source voltage $V_{GS}$ of 1200V, and a rated drain-source current $I_{DS}$ of 120A. Furthermore, the MOSFET as part of the semiconductor power device 14 has a drain-to-source on-state resistance Rds(ON) of 9 mΩ at 25° C., a turn-on gate resistor $R_{G-ON}$ of 1.5 kΩ, a turn-off gate resistor $R_{G-OFF}$ of 3 kΩ, a series-split gate resistor $R_G$ of 0Ω, an input capacitance $C_{ISS}$ of 8.5 nF, and a threshold voltage $V_{TH}$ that is 5V. Therefore, the shunt capacitor $C_{GSNT}$ is calculated using equations (1) and (2), as provided above, and equals 8.5 nF. Accordingly, a value of the shunt resistor $R_{GSNT}$ is determined to be 22Ω.

FIG. 9A is graphs showing voltage and current characteristics of the discrete semiconductor power device 14 of the power system 10, as shown in FIG. 1, during a turn-off transition, having a shunt capacitor $C_{GSNT}$ and a shunt resistor $R_{GSNT}$, and wherein the discrete semiconductor power device 14 comprises electrical characteristics that are suitable for slow-switching applications. The first graph shows a gate-source voltage $V_{GS}$ over time ($V_{GS}$-Time) as the semiconductor power device 14 turns off. The second graph shows a drain-source voltage $V_{GS}$ over time ($V_{DS}$-Time) as the semiconductor power device 14 turns off. The third graph shows a drain-source current $I_{DS}$ over time ($I_{DS}$-Time) as the semiconductor power device 14 turns off. In this regard, a turn-off time ($t_{off}$) is measured and approximately equals 3 μs, a turn-off delay time ($t_{d(off)}$) is measured and approximately equals 2 μs, a turn-off current rate ($di/dt_{off}$) is measured and approximately equals 0.05 A/ns, a turn-off voltage rate ($dv/dt_{off}$) is measured and approximately equals 0.88V/ns, and a voltage rise time ($t_r$) is measured and approximately equals 1 μs.

FIG. 9B is graphs showing voltage and current characteristics of the semiconductor power device 14 of the power system 10, as shown in FIG. 1, during a turn-on transition, having a shunt capacitor $C_{GSNT}$ and a shunt resistor $R_{GSNT}$, and wherein the semiconductor power device 14 comprises electrical characteristics that are suitable for slow-switching applications. The first graph shows a gate-source voltage $V_{GS}$ over time ($V_{GS}$-Time) as the semiconductor power device 14 turns on. The second graph shows a drain-source voltage $V_{DS}$ over time ($V_{DS}$-Time) as the semiconductor power device 14 turns on. The third graph shows a drain-source current $I_{DS}$ over time ($I_{DS}$-Time) as the semiconductor power device 14 turns on. In this regard, a turn-on time ($t_{on}$) is measured and approximately equals 5.5 μs, a turn-on delay time ($t_{d(on)}$) is measured and approximately equals 4.5 μs, a turn-on current rate ($di/dt_{on}$) is measured and approximately equals 0.07 A/ns, a turn-on voltage rate ($dv/dt_{on}$) is measured and approximately equals 0.87V/ns, and a voltage fall time ($t_r$) is measured and approximately equals 1 μs.

Therefore, as shown, the turn-off delay time ($t_{d(off)}$) and the turn-on delay time ($t_{d(on)}$) as measured in FIGS. 9A and 9B are substantially reduced compared with those of FIGS. 8A and 8B due to the introduction of the shunt capacitor $C_{GSNT}$ and the shunt resistor $R_{GSNT}$.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A voltage-source gate driver comprising:
 a power converter including an input configured to receive a first gate signal and provide a regulated output voltage at an output node;
 a gate-driver resistor network coupled between the output node of the power converter and an output terminal of the voltage-source gate driver, the gate-driver resistor network comprising:
  a turn-on resistor coupled in series with a first diode configured to rectify a current through the turn-on resistor in a first direction toward the output terminal of the voltage-source gate driver; and
  a turn-off resistor coupled in series with a second diode configured to rectify a current through the turn-off resistor in a second direction away from the output terminal of the voltage-source gate driver; and
 a shunt capacitor connected in series with a shunt resistor, wherein the shunt capacitor and shunt resistor are connected in parallel across the gate-driver resistor network; and
 wherein the output terminal is configured to provide a second gate signal to a gate of a semiconductor power device.

2. The voltage-source gate driver of claim 1, wherein the shunt capacitor has a value that is calculated using the following equations:

$$(V_{DD} - V_{EE}) \times \frac{C_{GSNT}}{C_{GSNT} + C_{ISS}} + V_{EE} = V_{TH}$$

$$V_{DD} - (V_{DD} - V_{EE}) \times \frac{C_{GSNT}}{C_{GSNT} + C_{ISS}} = V_{TH}$$

wherein $V_{DD}$ is a positive supply voltage, $V_{EE}$ is a negative supply voltage, $C_{ISS}$ is an input capacitance of the semiconductor power device, and $V_{TH}$ is a threshold voltage of the semiconductor power device.

3. The voltage-source gate driver of claim 1, wherein the shunt resistor is greater than 0Ω and less than or equal to 10MΩ.

4. The voltage-source gate driver of claim 1, wherein the gate-driver resistor network has an equivalent resistance value greater than 0Ω and less than or equal to 10MΩ.

5. The voltage-source gate driver of claim 1, wherein the power converter comprises one of a voltage rectifier, regulator, inverter, or converter.

6. The voltage-source gate driver of claim 1, further comprising a solid-state circuit breaker.

7. The voltage-source gate driver of claim 1, wherein the semiconductor power device includes a half-bridge circuit topology.

8. The voltage-source gate driver of claim 1, wherein the semiconductor power device is a paralleled transistor connection circuit topology.

9. The voltage-source gate driver of claim 1, wherein the semiconductor power device is a common-source circuit topology.

10. The voltage-source gate driver of claim 1, wherein the semiconductor power device is one of a half-bridge circuit topology, a paralleled transistor connection circuit topology, or a common-source circuit topology.

11. The voltage-source gate driver of claim 1, wherein the semiconductor power device is a metal-oxide field-effect transistor.

12. The voltage-source gate driver of claim 1, wherein the semiconductor power device is one of an insulated gate bipolar transistor (IGBT), a junction-gate field-effect transistor (JFET), or a high electron mobility transistor (HEMT).

13. A power system comprising:
 a voltage-source gate driver comprising:
  a power converter including an input configured to receive a first gate signal and provide a regulated output voltage at an output node;
  a gate-driver resistor network coupled between the output node of the power converter and an output terminal of the voltage-source gate driver, the gate-driver resistor network comprising:
   a turn-on resistor coupled in series with a first diode configured to rectify a current through the turn-on resistor in a first direction toward the output terminal of the voltage-source gate driver; and a turn-off resistor coupled in series with a second diode configured to rectify a current through the turn-off resistor in a second direction away from the output terminal of the voltage-source gate driver;

a shunt capacitor connected in series with a shunt resistor, wherein the shunt capacitor and shunt resistor are connected in parallel across the gate-driver resistor network; and the output terminal configured to provide a second gate signal; and a semiconductor power device comprising a gate terminal, a drain terminal, and a source terminal, wherein the semiconductor power device is configured to receive the second gate signal at the gate terminal.

14. The power system of claim 13, wherein the shunt capacitor has a value that is calculated using the following equations:

$$(V_{DD} - V_{EE}) \times \frac{C_{GSNT}}{C_{GSNT} + C_{ISS}} + V_{EE} = V_{TH}$$

$$V_{DD} - (V_{DD} - V_{EE}) \times \frac{C_{GSNT}}{C_{GSNT} + C_{ISS}} = V_{TH}$$

wherein $V_{DD}$ is a positive supply voltage, $V_{EE}$ is a negative supply voltage, $C_{ISS}$ is an input capacitance of the semiconductor power device, and $V_{TH}$ is a threshold voltage of the semiconductor power device.

15. The power system of claim 13, wherein the shunt resistor is greater than 0Ω and less than or equal to 10MΩ.

16. The power system of claim 13, wherein the gate-driver resistor network has an equivalent resistance value greater than 0Ω and less than or equal to 10MΩ.

17. The power system of claim 13, wherein the power converter comprises one of a voltage rectifier, regulator, inverter, or converter.

18. The power system of claim 13, wherein the semiconductor power device is a metal-oxide field-effect transistor.

19. The power system of claim 13, wherein the semiconductor power device is one of a half-bridge circuit topology, a paralleled transistor connection circuit topology, or a common-source circuit topology.

20. The power system of claim 13, wherein the semiconductor power device is one of an insulated gate bipolar transistor (IGBT), a junction-gate field-effect transistor (JFET), or a high electron mobility transistor (HEMT).

* * * * *